United States Patent
Isobe et al.

(10) Patent No.: US 10,527,643 B2
(45) Date of Patent: Jan. 7, 2020

(54) INERTIA SENSOR WITH IMPROVED DETECTION SENSITIVITY USING SERVO VOLTAGE TO DETECT A PHYSICAL QUANTITY

(71) Applicant: Hitachi, Ltd., Chiyoda-ku, Tokyo (JP)

(72) Inventors: Atsushi Isobe, Tokyo (JP); Yuki Furubayashi, Tokyo (JP); Takashi Oshima, Tokyo (JP); Yuudai Kamada, Tokyo (JP); Takashi Shiota, Tokyo (JP); Chisaki Takubo, Tokyo (JP); Noriyuki Sakuma, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 180 days.

(21) Appl. No.: 15/742,550

(22) PCT Filed: Jul. 10, 2015

(86) PCT No.: PCT/JP2015/069839
§ 371 (c)(1),
(2) Date: Jan. 8, 2018

(87) PCT Pub. No.: WO2017/009885
PCT Pub. Date: Jan. 19, 2017

(65) Prior Publication Data
US 2018/0210005 A1 Jul. 26, 2018

(51) Int. Cl.
*G01P 15/125* (2006.01)
*G01P 15/08* (2006.01)
(Continued)

(52) U.S. Cl.
CPC ........ *G01P 15/125* (2013.01); *G01P 15/0802* (2013.01); *G01P 15/131* (2013.01); *G01P 15/18* (2013.01); *B81B 2201/0235* (2013.01)

(58) Field of Classification Search
CPC .. G01P 15/125; G01P 15/0802; G01P 15/131; G01P 15/18; B81B 2201/0235; B81B 3/0016; G01C 19/56
See application file for complete search history.

(56) References Cited

U.S. PATENT DOCUMENTS

| 5,698,783 | A | * | 12/1997 | Murakoshi | ............. | G01C 19/24 |
| | | | | | | 73/504.03 |
| 2011/0252886 | A1 | * | 10/2011 | Asano | ................ | G01C 19/5614 |
| | | | | | | 73/504.12 |

(Continued)

FOREIGN PATENT DOCUMENTS

JP 2006-170704 A 6/2006
JP 2006170704 * 6/2006
(Continued)

OTHER PUBLICATIONS

International Search Report (PCT/ISA/210) issued in PCT Application No. PCT/JP2015/069839 dated Oct. 6, 2015 with English translation (2 pages).

(Continued)

*Primary Examiner* — Harshad R Patel
*Assistant Examiner* — Nigel H Plumb
(74) *Attorney, Agent, or Firm* — Crowell & Moring LLP

(57) ABSTRACT

There is provided an inertia sensor with low noise and high sensitivity. The inertia sensor captures a physical quantity as a change of electrostatic capacitance and detects the physical quantity based on a servo voltage generating electrostatic force that cancels the change of the electrostatic capacitance. The inertia sensor includes a detection capacitor unit that captures the physical quantity as the change of the electrostatic capacitance and a servo capacitor unit to which the servo voltage is applied. Here, the detection capacitor unit and the servo capacitor unit are connected mechanically through an insulation material.

13 Claims, 13 Drawing Sheets

(51) Int. Cl.
*G01P 15/13* (2006.01)
*G01P 15/18* (2013.01)

(56) References Cited

U.S. PATENT DOCUMENTS

2014/0217929 A1* 8/2014 Lin ................... H02N 1/006
                                                      318/116
2014/0230551 A1* 8/2014 Kuninni ............. G01P 15/0802
                                                      73/514.32

FOREIGN PATENT DOCUMENTS

| JP | 2010-181207 A | 8/2010 |
| JP | 2012-163507 A | 8/2012 |
| JP | 2013-76610 A | 4/2013 |
| JP | 2014-102172 A | 6/2014 |
| JP | 2014-153363 A | 8/2014 |

OTHER PUBLICATIONS

Japanese-language Written Opinion (PCT/ISA/237) issued in PCT Application No. PCT/JP2015/069839 dated Oct. 6, 2015 (3 pages).

* cited by examiner

[Fig. 1]
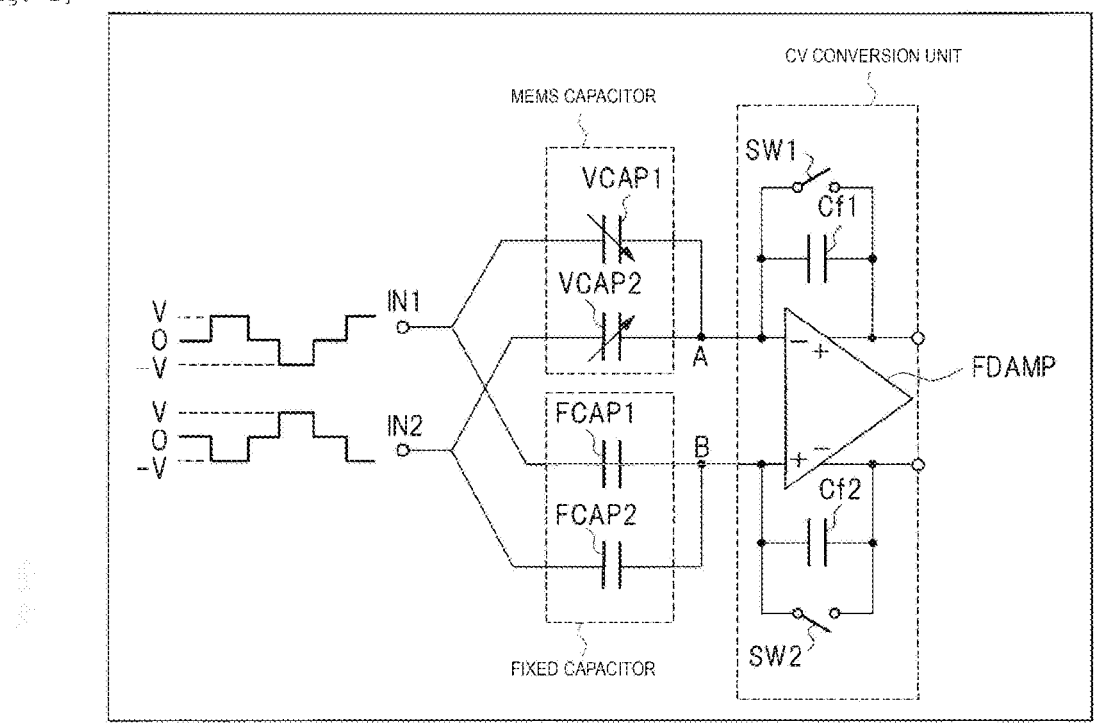
Prior Art

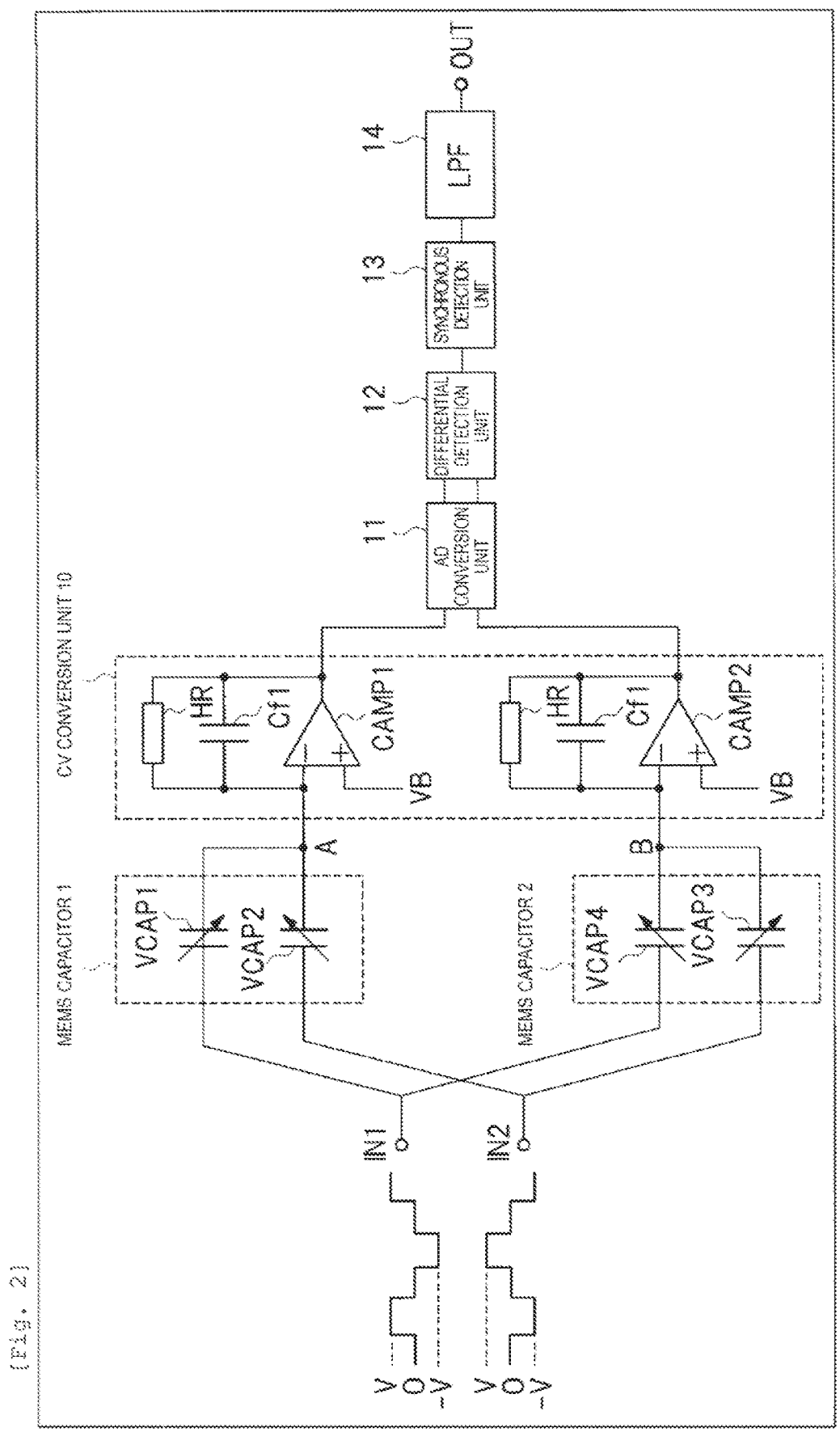
[Fig. 2]

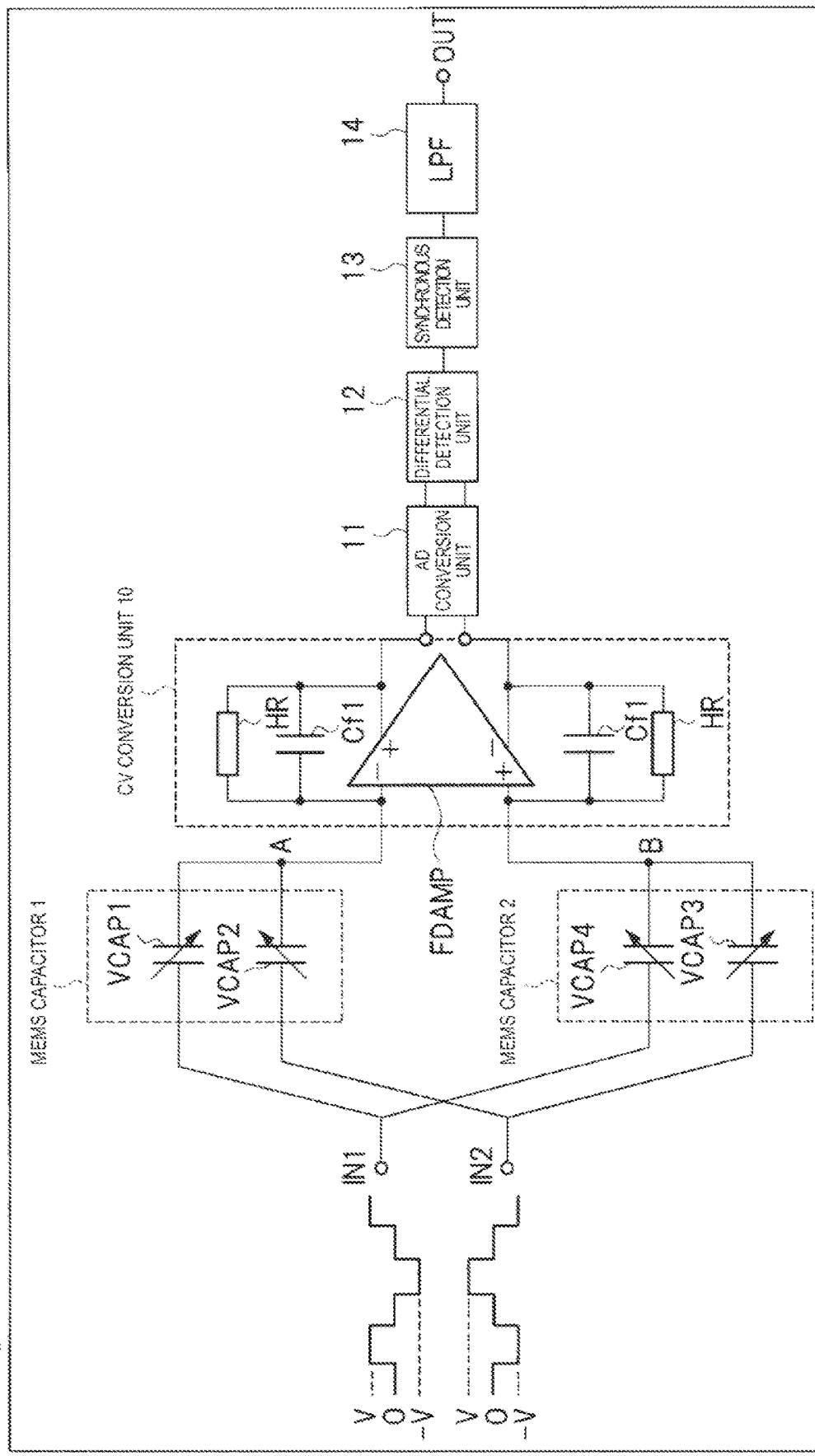
[Fig. 3]

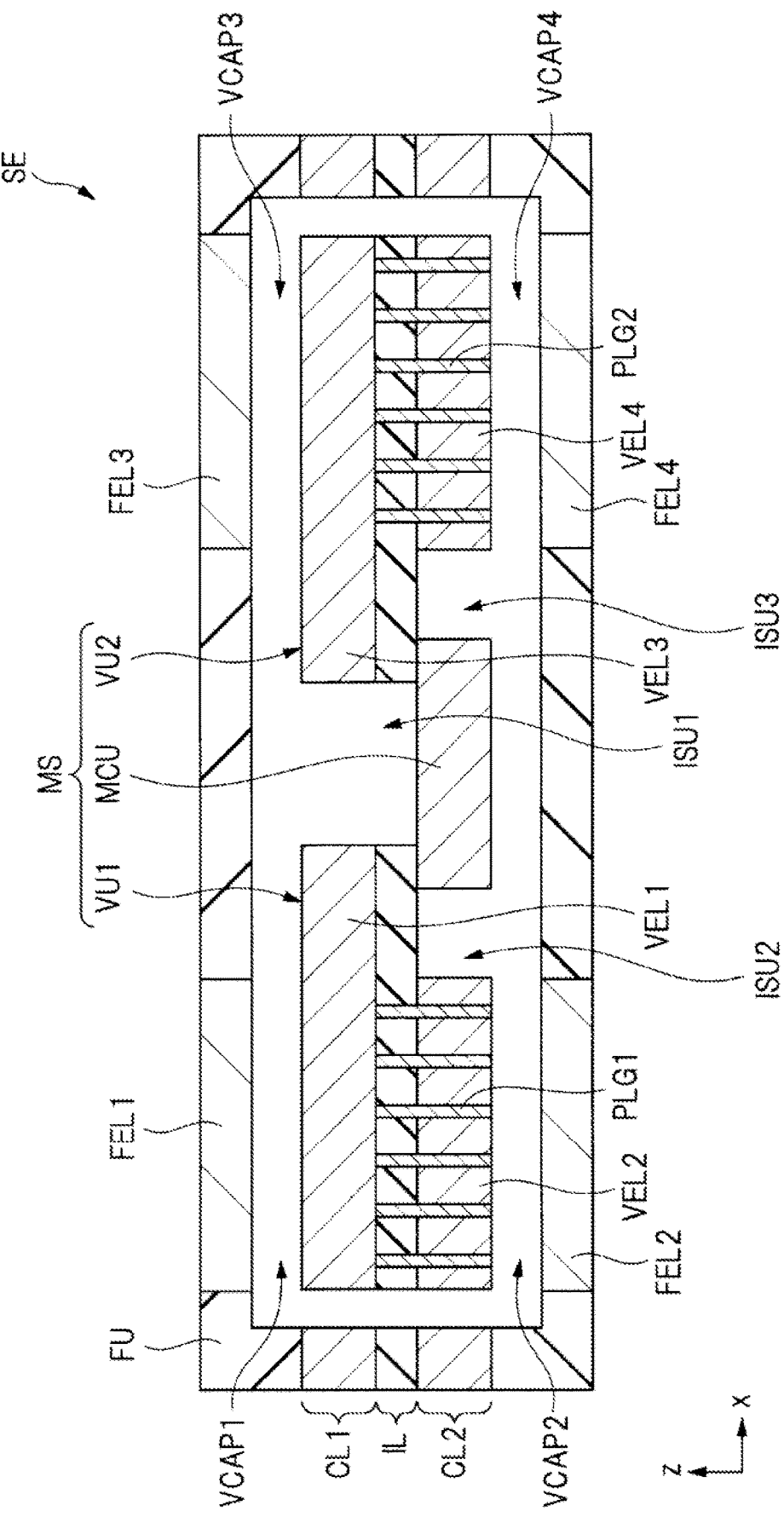
[Fig. 4]

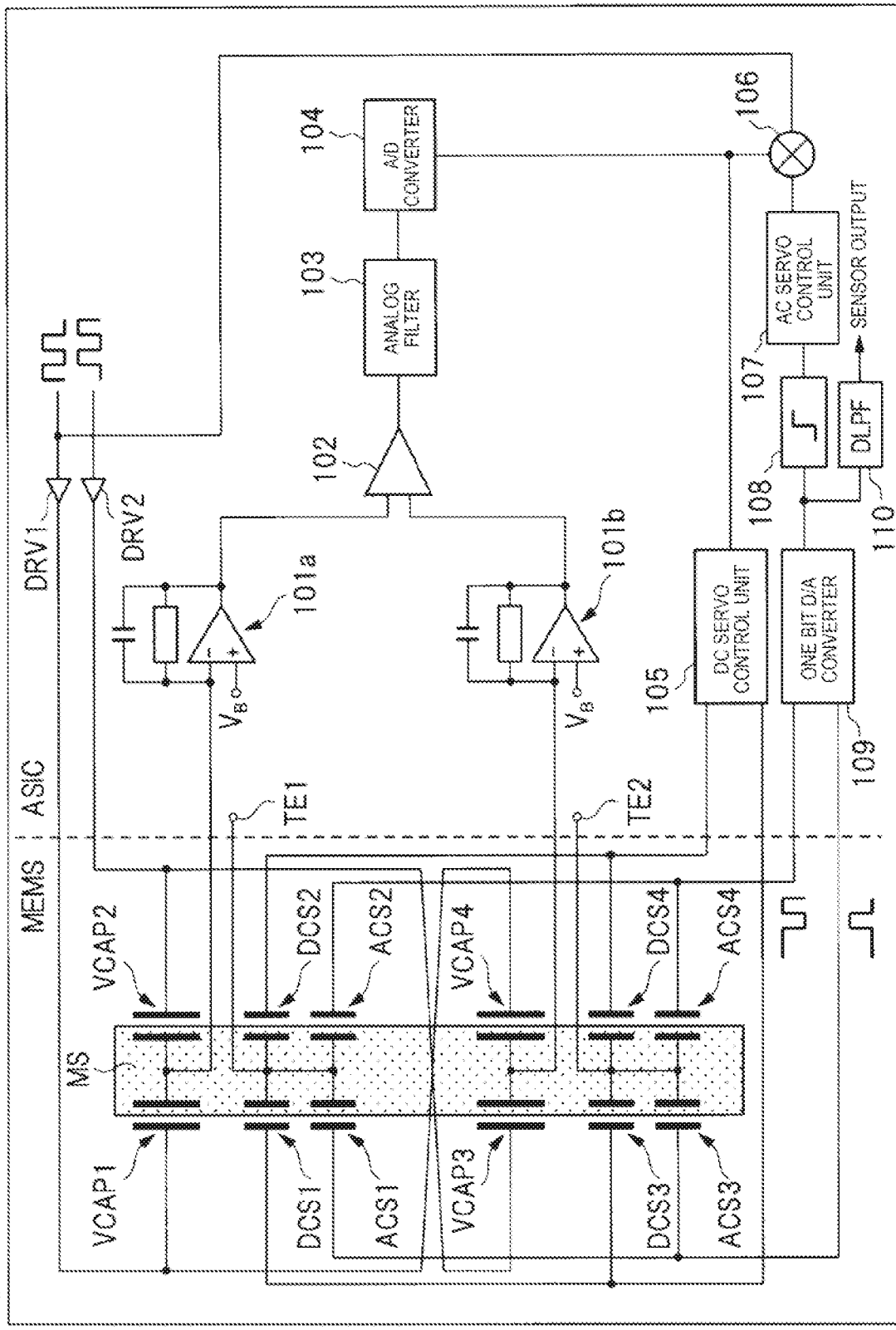
[Fig. 5]

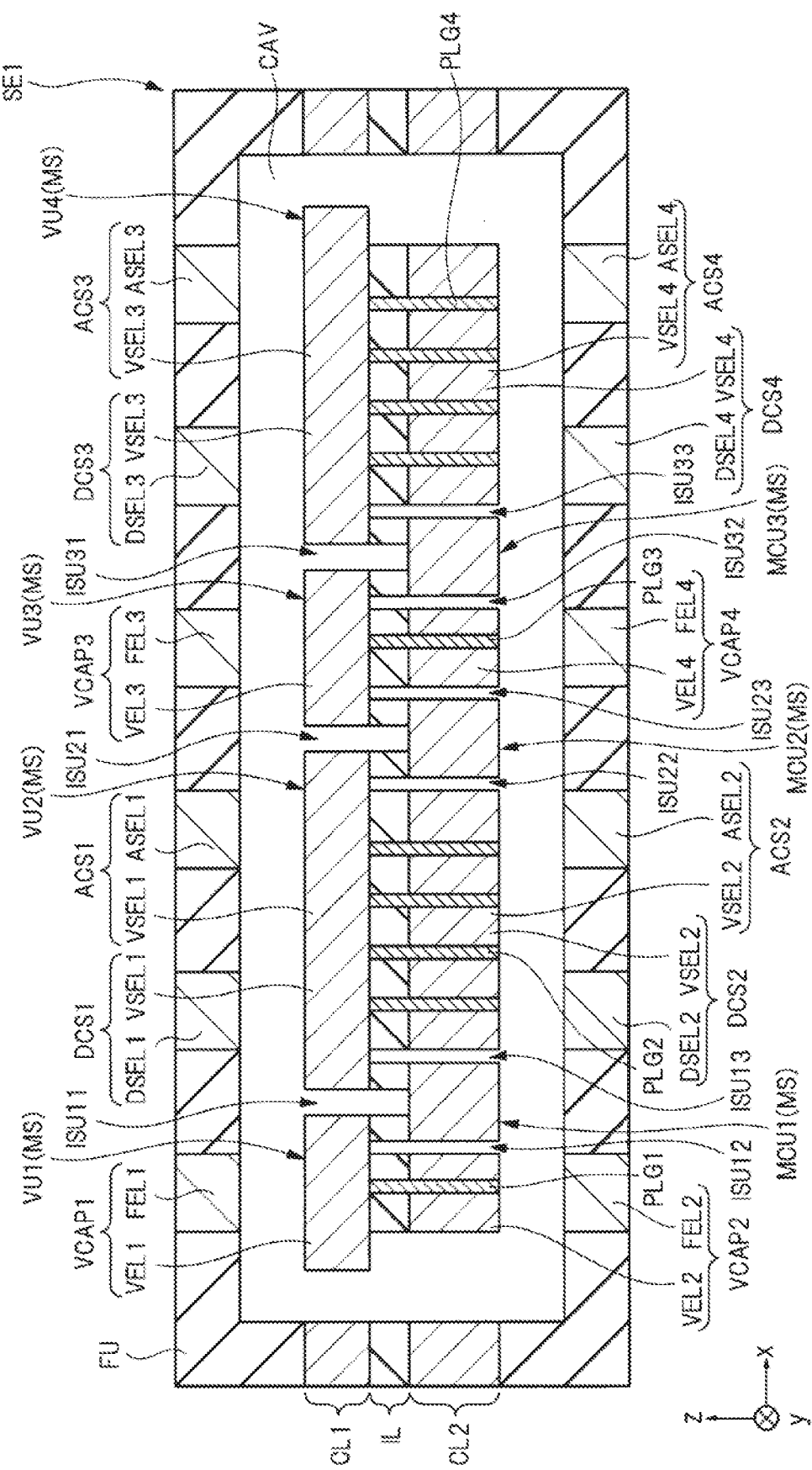
[Fig. 6]

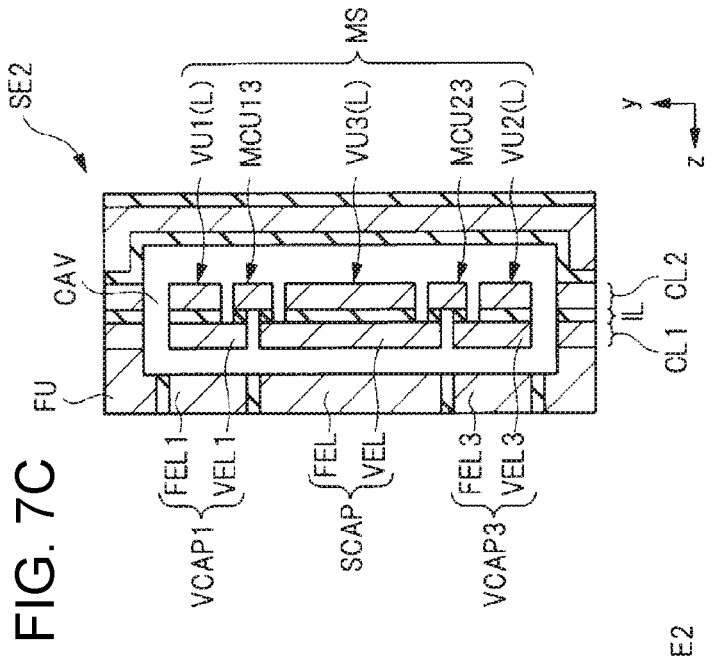
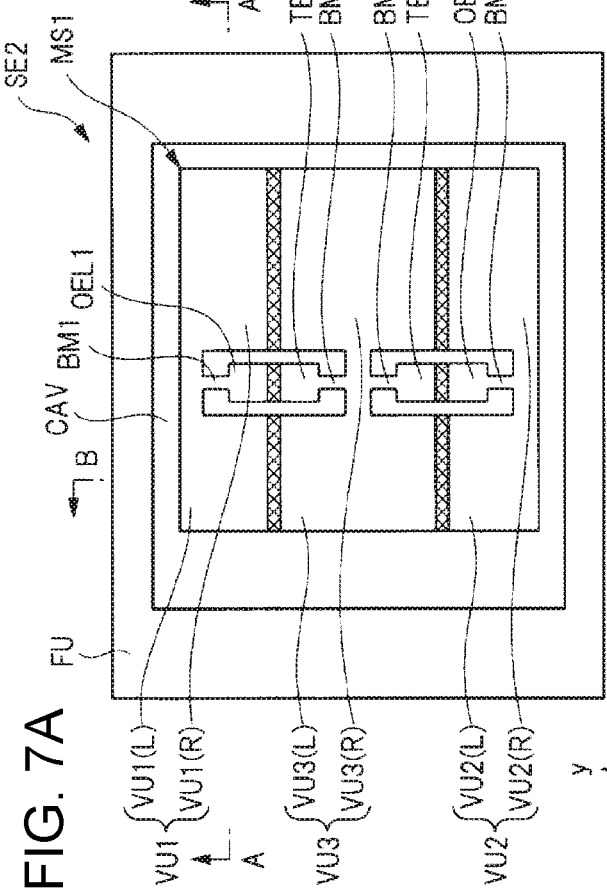
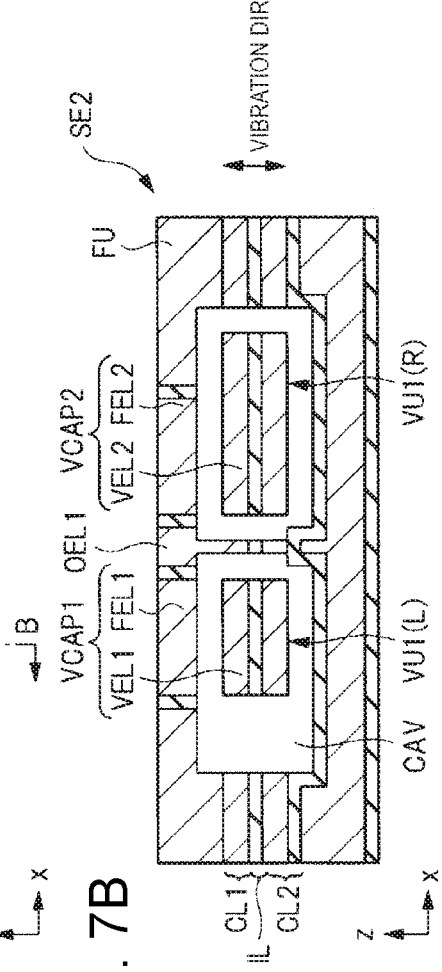
FIG. 7A
FIG. 7B
FIG. 7C

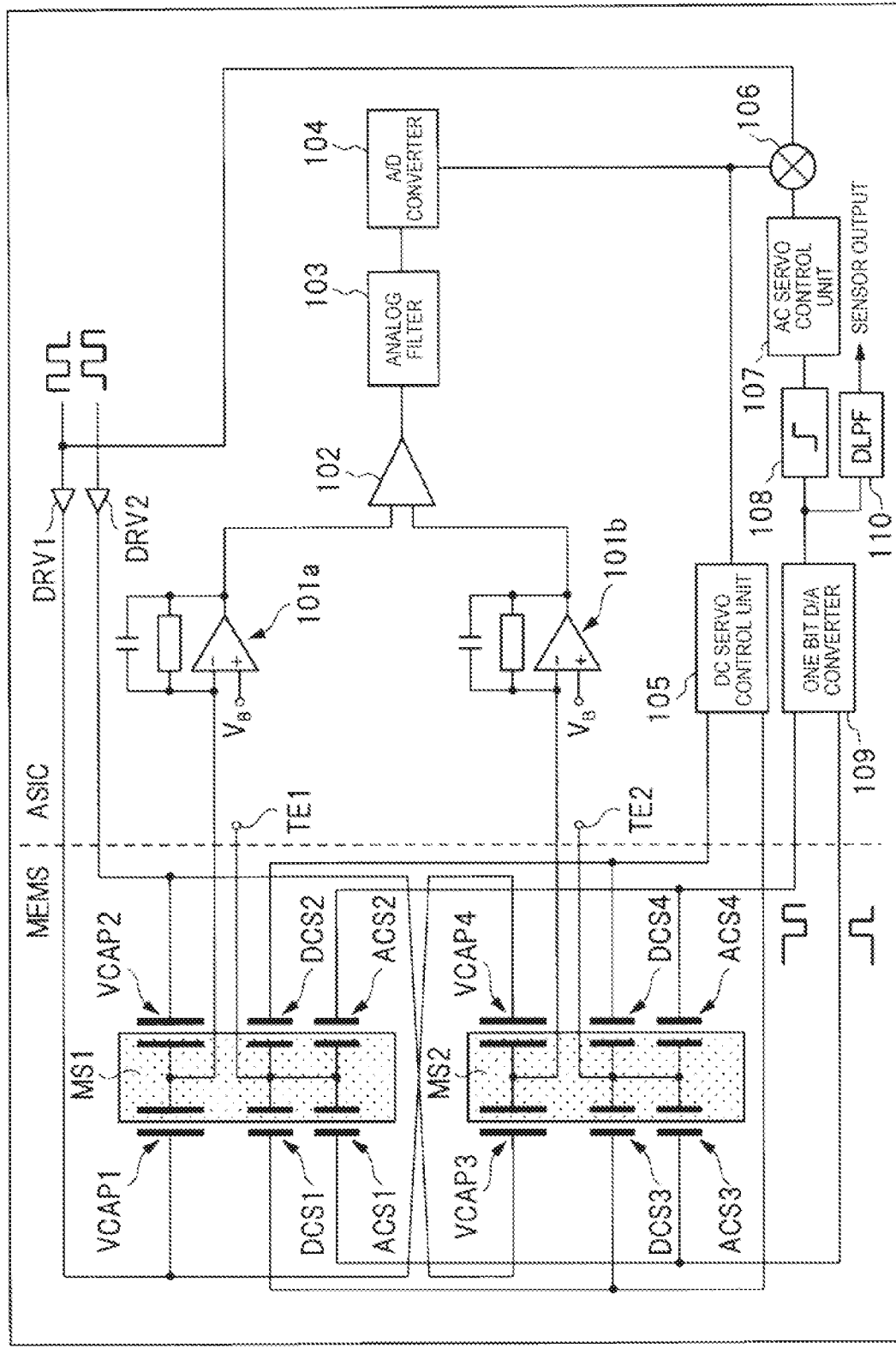
[Fig. 8]

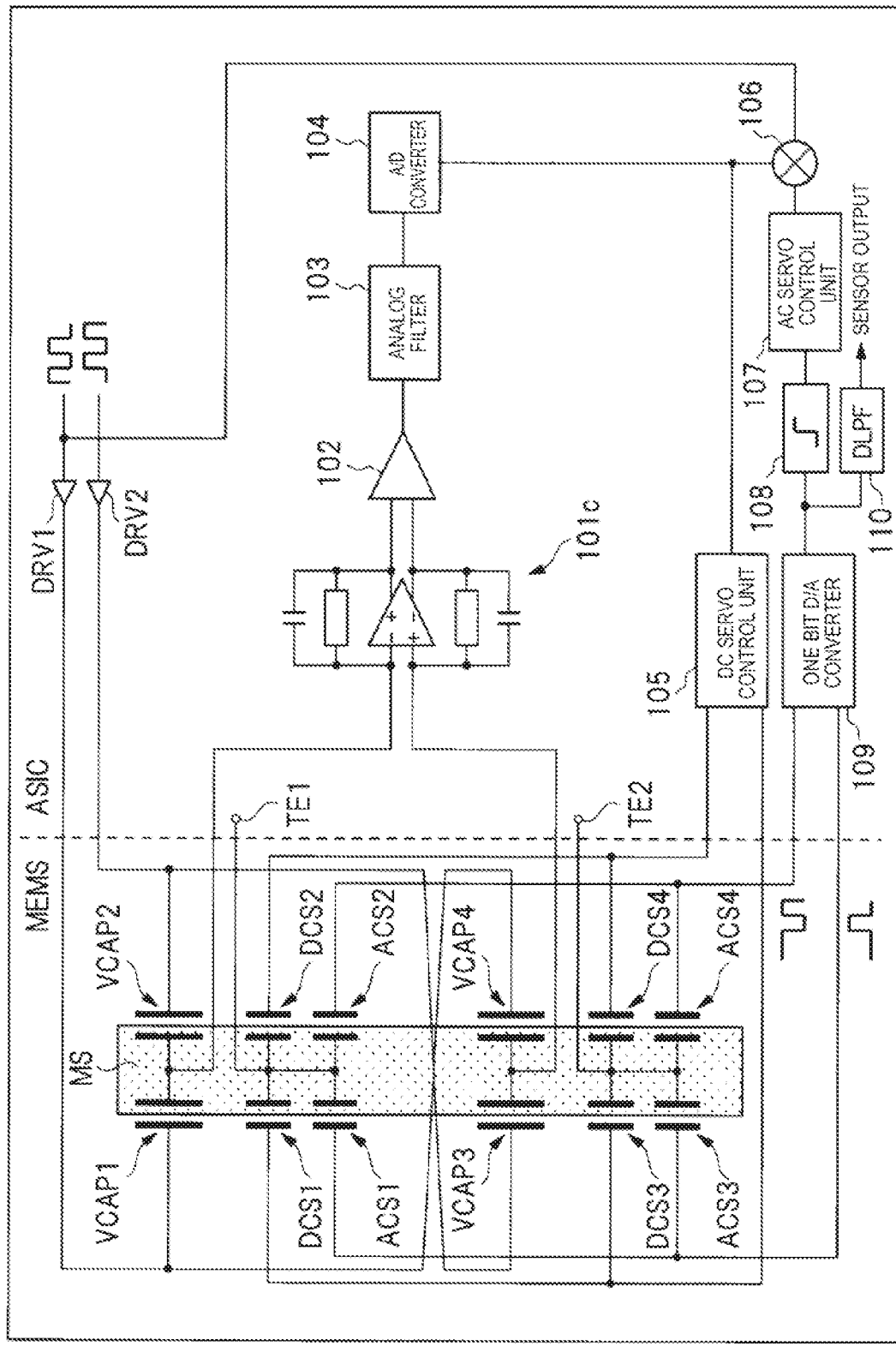
[Fig. 9]

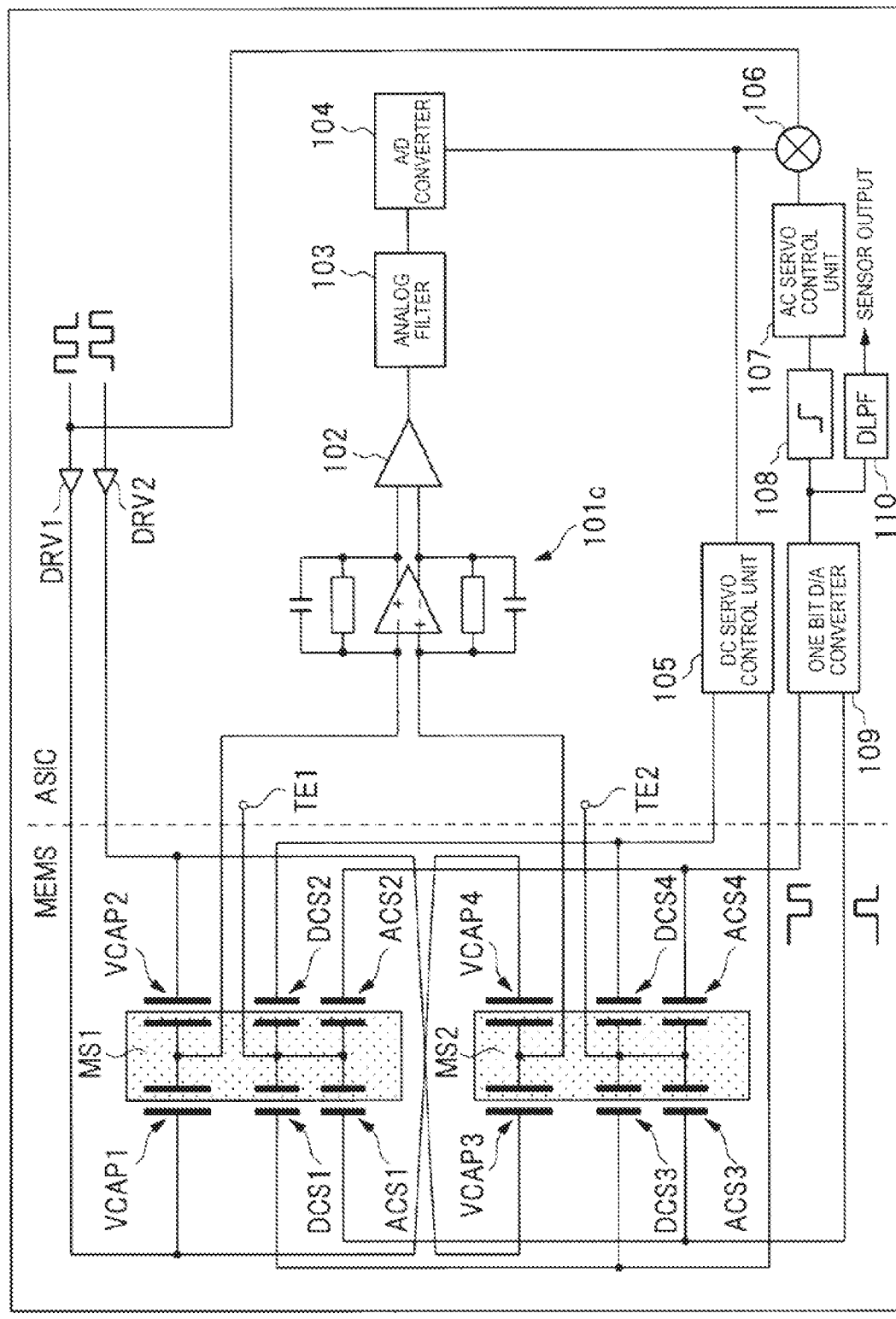
[Fig. 10]

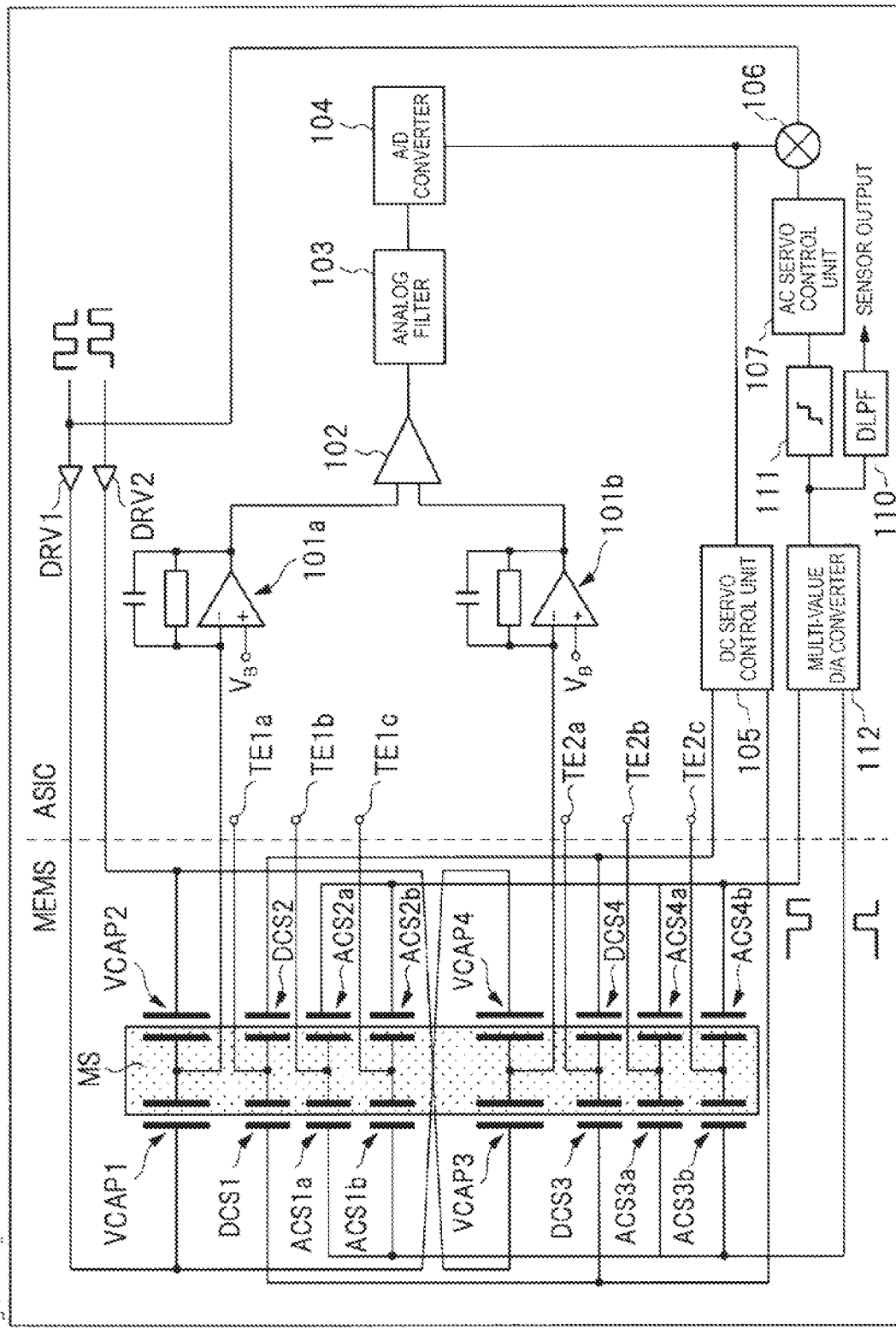
[Fig. 11]

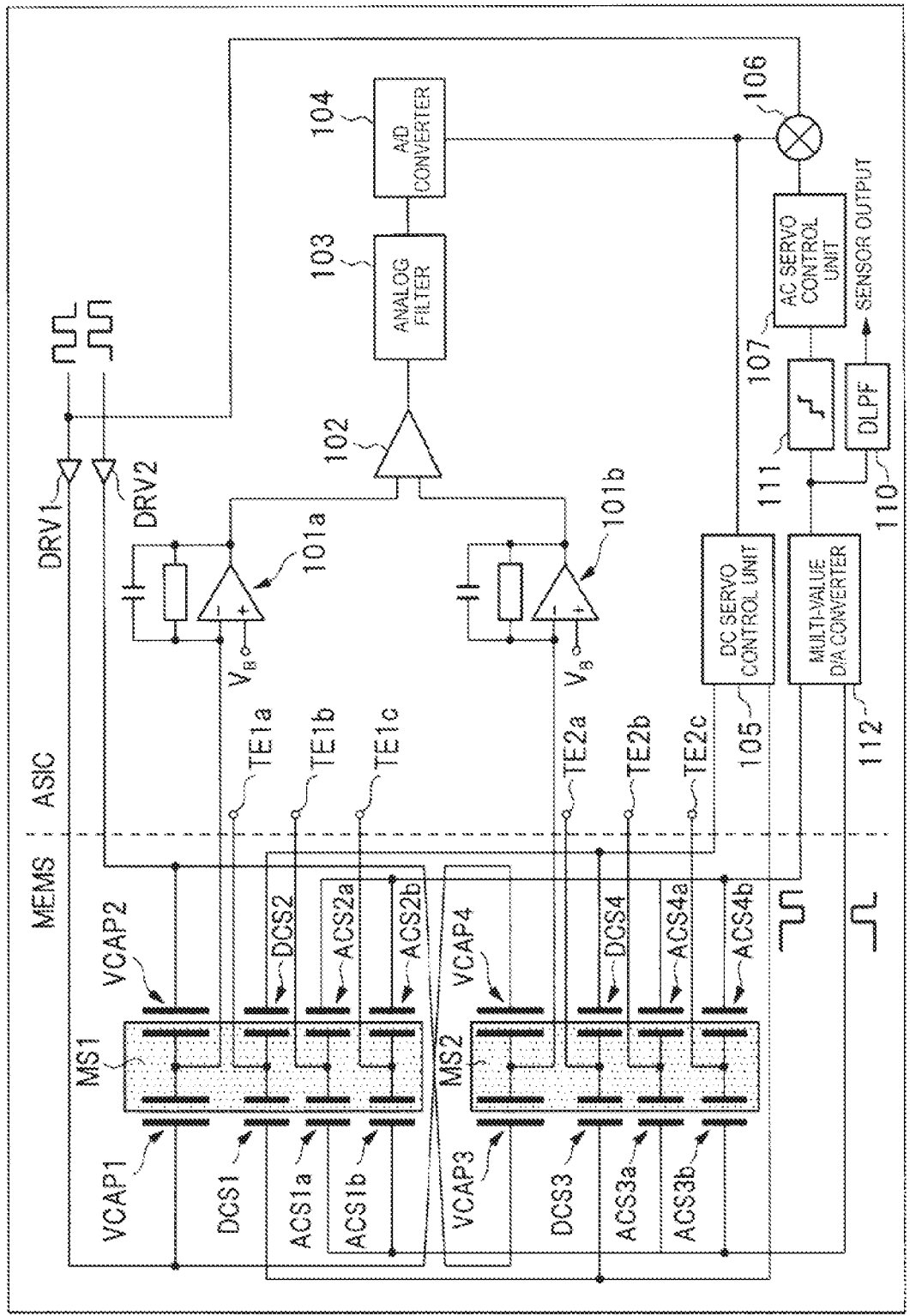
[Fig. 12]

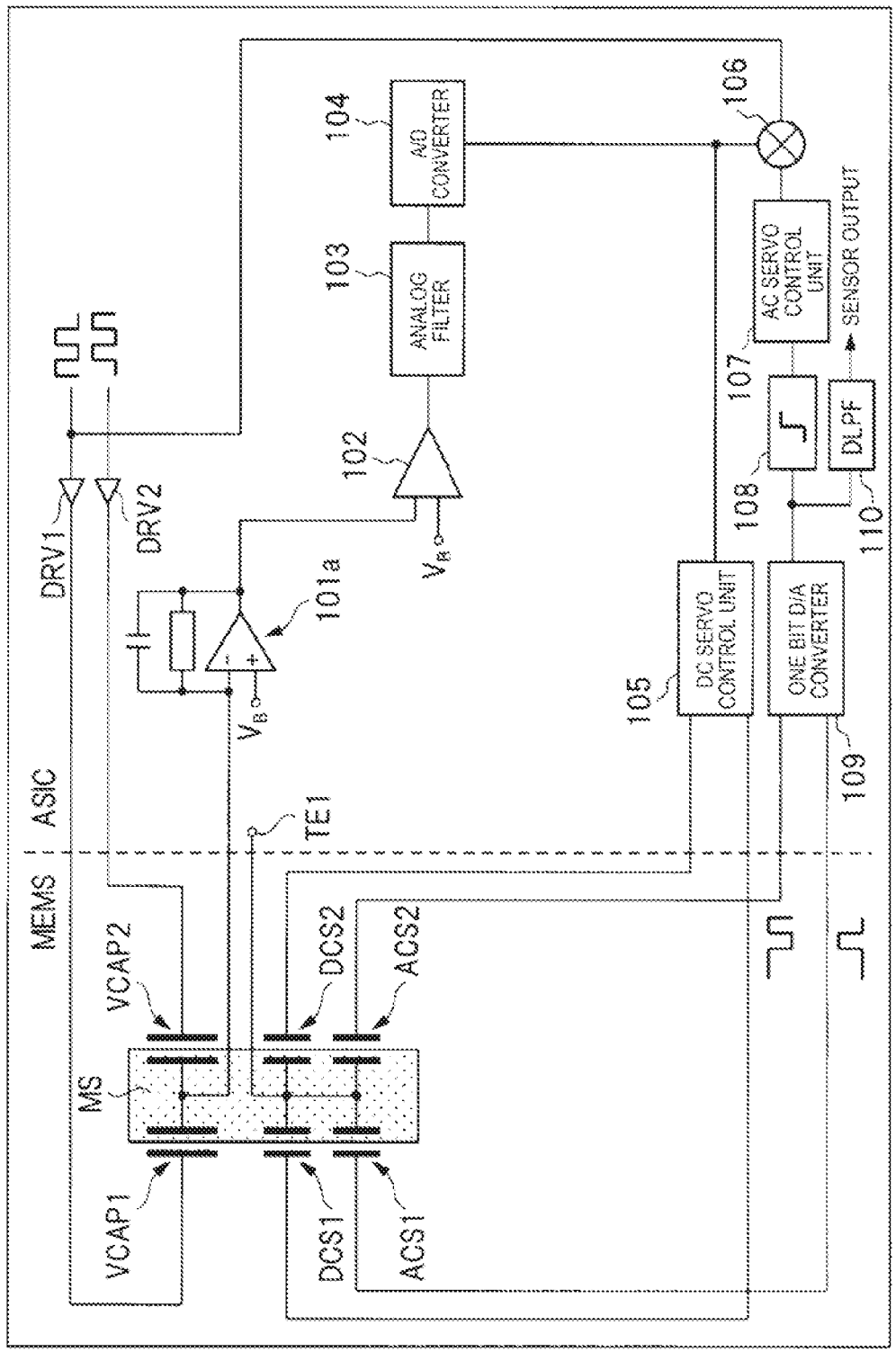
[Fig. 13]

INERTIA SENSOR WITH IMPROVED DETECTION SENSITIVITY USING SERVO VOLTAGE TO DETECT A PHYSICAL QUANTITY

TECHNICAL FIELD

The present invention relates to an inertia sensor, for example, an effective technique employed in an acceleration sensor for detecting infinitesimal vibration acceleration.

BACKGROUND ART

JP-A-2013-076610 (PTL 1) discloses a technique relating to an acceleration sensor including a C/V conversion circuit in which electrostatic capacitance increases or decreases with respect to acceleration by applying sine signals having opposite phases to a pair of capacitance elements.

JP-A-2014-102172 (PTL 2) discloses a technique relating to an acceleration sensor including a C/V conversion circuit using a complete differential operational amplifier (fully differential operational amplifier). Specifically, an output signal from a pair of capacitance elements to which voltage signals having opposite phases are applied is input to the inverting input of the complete differential operational amplifier, and an output signal from a pair of fixed capacitor elements having the same capacitance as the pair of capacitance elements described above is input to the non-inverting input of the complete differential operational amplifier.

JP-A-2010-181207 (PTL 3) discloses a configuration of electrically separating a detection electrode and a driving electrode in an angular velocity sensor.

CITATION LIST

Patent Literature

PTL 1: JP-A-2013-076610
PTL 2: JP-A-2014-102172
PTL 3: JP-A-2010-181207

SUMMARY OF INVENTION

Technical Problem

An reflection method seismic exploration is a method of exploring depth distribution of an underground reflecting surface or an underground structure by measuring a reflected wave returning to the ground reflected from the underground reflecting surface (boundary surface on which acoustic impedance is changed) by geophones placed on the ground and analyzing the reflected wave using a shock wave or a continuous wave generated on the ground. For example, the reflection method seismic exploration is used widely as a main exploration method of oil or natural gas. In particular, as a next-generation sensor for the reflection method seismic exploration, an acceleration sensor for detecting infinitesimal vibration acceleration much smaller than the gravitational acceleration is attracting attention. In order to put such acceleration sensor into practical use, it is desired to develop an acceleration sensor with low noise and very high sensitivity.

The object of the present invention is to provide an inertia sensor with low noise and high sensitivity.

Other problems and new features will be apparent from the description of the specification and the drawings.

Solution to Problem

An inertia sensor according to an embodiment includes an inertia sensor that captures a physical quantity (for example, acceleration and angular velocity) as a change of electrostatic capacitance and detects the physical quantity based on a servo voltage generating electrostatic force that cancels the change of the electrostatic capacitance. The inertia sensor includes a detection capacitor unit that captures the physical quantity as the change of the electrostatic capacitance and a servo capacitor unit to which the servo voltage is applied, and the detection capacitor unit and the servo capacitor unit are connected mechanically through an insulation material.

Advantageous Effects of Invention

According to one embodiment, it is possible to provide an inertia sensor with low noise and high sensitivity.

BRIEF DESCRIPTION OF DRAWINGS

FIG. 1 is a schematic circuit diagram illustrating a configuration example of a sensor unit and a CV conversion unit of an acceleration sensor in a related art.

FIG. 2 is a diagram illustrating a schematic circuit configuration of an acceleration sensor according to embodiment 1.

FIG. 3 is a diagram illustrating a modification example of the circuit configuration illustrated in FIG. 2.

FIG. 4 is a cross-sectional view illustrating a device structure of a sensor element of the acceleration sensor according to the embodiment 1.

FIG. 5 is a diagram illustrating one example of a schematic configuration of an acceleration sensor according to embodiment 2.

FIG. 6 is a cross-sectional view illustrating a device structure of a sensor element of the acceleration sensor according to the embodiment 2.

FIG. 7A is a plan view illustrating a device structure of a sensor element according to a modification example, FIG. 7B is a cross-sectional view taken along line A-A of FIG. 7A, and FIG. 7C is a cross-sectional view taken along line B-B of FIG. 7A.

FIG. 8 is a diagram illustrating a configuration of an acceleration sensor according to embodiment 3.

FIG. 9 is a diagram illustrating a configuration of an acceleration sensor according to embodiment 4.

FIG. 10 is a diagram illustrating a configuration of an acceleration sensor according to embodiment 5.

FIG. 11 is a diagram illustrating a configuration of an acceleration sensor according to embodiment 6.

FIG. 12 is a diagram illustrating a configuration of an acceleration sensor according to embodiment 7.

FIG. 13 is a diagram illustrating a configuration of an acceleration sensor according to embodiment 8.

DESCRIPTION OF EMBODIMENTS

The following embodiments will be described divided into a plurality of sections or embodiments as necessary for convenience. However, unless otherwise stated, the sections or the embodiments are related to each other, and one is in a relationship such as a modification example, details, or a supplementary explanation of a part or whole of the other.

In the following embodiments, in a case where a number of elements or the like (includes the number of elements, numerical value, amount, range, and the like) is mentioned, unless otherwise stated and it is limited obviously to a specific number in principle, it is not limited to the specific number and may be bigger than the specific number, or smaller than the specific number.

Further, in the following embodiments, unless otherwise stated and it is considered obviously indispensable in principle, it goes without saying that a configuration element (includes element step or the like) is not necessarily indispensable.

In the following embodiments, similarly, in a case where a shape of the configuration element or the like or a positional relationship or the like is mentioned, unless otherwise stated and it is considered obviously unlikely in principle, it is intended to include a shape which is substantially approximate or similar to the shape or the like. This also applies to the numerical value and the range described above.

In all drawings for describing the embodiments, the same reference numeral will be assigned to the same member as a rule and the repeated description thereof will be omitted. A plan view may also be hatched to make a drawing easier to understand.

Embodiment 1

<Review for Improvement>

In the technique disclosed in PTL 1, the sine signals (input signals) having opposite phases are applied to each variable capacitor element using a pair of variable capacitor elements in which the electrostatic capacitance increases or decreases with respect to the acceleration. Thereby, in the technique disclosed in PTL 1, a capacitance change is converted into a voltage signal by a CV conversion unit, and finally a detection signal corresponding to the acceleration is obtained based on the capacitance change generated when the acceleration is applied. However, in the technique disclosed in PTL 1, in a case where an external noise is included in the input signals, the external noise may have an adverse influence on the detection signal.

Therefore, for example, as a technique for suppressing the adverse influence due to the external noise, there is a related art illustrated in the following PTL 2. Hereinafter, the related art will be described.

FIG. 1 is, for example, a schematic circuit diagram illustrating a configuration example of a sensor unit and a CV conversion unit of an acceleration sensor in the related art illustrated in PTL 2. In FIG. 1, the acceleration sensor in the related art has an input terminal IN1 and an input terminal IN2. A variable capacitor element VCAP1 and a variable capacitor element VCAP2 are connected in series between the input terminal IN1 and the input terminal IN2. Similarly, a fixed capacitor element FCAP1 and a fixed capacitor element FCAP2 are connected in series between the input terminal IN1 and the input terminal IN2.

At the time, the variable capacitor element VCAP1 and the variable capacitor element VCAP2 are configured such that the electrostatic capacitances of the elements are changed by the acceleration applied from the outside and are MEMS capacitor formed of a micro electrical mechanical systems (MEMS) structure. On the other hand, the fixed capacitor element FCAP1 and the fixed capacitor element FCAP2 are, for example, formed on a semiconductor chip as a part of an integrated circuit formed by the CMOS process.

An intermediate node A between the variable capacitor element VCAP1 and the variable capacitor element VCAP2 is connected to the inverting input terminal of a fully differential operational amplifier (complete differential operational amplifier) FDAMP configuring the CV conversion unit. On the other hand, an intermediate node B between the fixed capacitor element FCAP1 and the fixed capacitor element FCAP2 is connected to the non-inverting input terminal of the fully differential operational amplifier FDAMP.

As illustrated in FIG. 1, a feedback capacitor element Cf1 and a switch SW1 are connected in parallel between the inverting input terminal and the non-inverting output terminal of the fully differential operational amplifier FDAMP. On the other hand, as illustrated in FIG. 1, a feedback capacitor element Cf2 and a switch SW2 are connected in parallel between the non-inverting input terminal and the inverting output terminal of the fully differential operational amplifier FDAMP.

In the related art configured in the manner, for example, as illustrated in FIG. 1, input voltages having the opposite phases are applied to the input terminal IN1 and the input terminal IN2. Here, for example, it is considered that a case where an external noise ($V_z$) is added to the input voltage which is input to the input terminal IN1. In a case where an electrostatic capacitance of the variable capacitor element VCAP1 and an electrostatic capacitance of the fixed capacitor element FCAP1 have the same "C", a charge ($CV_z$) caused by the external noise is added to the variable capacitor element VCAP1 of the MEMS capacitor illustrated in FIG. 1 while the charge ($CV_z$) caused by the external noise is added also to the fixed capacitor element FCAP1 illustrated in FIG. 1 in the configuration of the related art. At the time, in the related art, cancellation occurs between the charge ($CV_z$) caused by the external noise added to the variable capacitor element VCAP1 and the charge ($CV_z$) caused by the external noise added to the fixed capacitor element FCAP1, and the "CVz" term which is the main term of the external noise is not included in both an output signal from the inverting output terminal of the fully differential operational amplifier FDAMP and an output signal from the non-inverting output terminal thereof. Accordingly, according to the configuration of the related art, it is considerable that it is possible to provide the acceleration sensor which is less susceptible to the external noise.

However, for example, the variable capacitor element VCAP1 and the variable capacitor element VCAP2 are formed on the MEMS structure while the fixed capacitor element FCAP1 and the fixed capacitor element FCAP2 are formed on the semiconductor chip on which the integrated circuit is formed. Here, the fabrication accuracy of the MEMS structure and the fabrication accuracy of the integrated circuit formed on the semiconductor chip are significantly different. Therefore, for example, there is a high possibility that the electrostatic capacitance of the variable capacitor element VCAP1 and the electrostatic capacitance of the fixed capacitor element FCAP1 are different from each other due to the difference in the fabrication accuracy (variation) in an actual product, even when the electrostatic capacitance of the variable capacitor element VCAP1 and the electrostatic capacitance of the fixed capacitor element FCAP1 are designed to have the same electrostatic capacitance "C" in terms of design. For example, when the electrostatic capacitance of the variable capacitor element VCAP1 is "C1" and the electrostatic capacitance of the fixed capacitor element FCAP1 is "C2", it is considered that the case where the external noise ($V_z$) is added to the input voltage which is input to the input terminal IN1 as described above.

In the case, a charge (C1Vz) caused by the external noise is added to the variable capacitor element VCAP1 of the MEMS capacitor illustrated in FIG. 1 while a charge (C2Vz) caused by the external noise is added to the fixed capacitor element FCAP1 thereof illustrated in FIG. 1. Accordingly, in the related art, in the case where the electrostatic capacitance of the variable capacitor element VCAP1 and the electrostatic capacitance of the fixed capacitor element FCAP1 are different from each other due to the difference in the fabrication accuracy, the charge (C1Vz) caused by the external noise added to the variable capacitor element VCAP1 and the charge (C2Vz) caused by the external noise added to the fixed capacitor element FCAP1 are not cancelled completely. This means, in the related art, that the external noise has the adverse influence on the output signal from the fully differential operational amplifier FDAMP. Accordingly, in the related art, there is room for improvement from the viewpoint of suppressing the influence of the external noise when considering the difference in the fabrication variation.

Therefore, in embodiment 1, contrivance is devised to find the room for improvement existing in the related art described above. Hereinafter, technical concept of the embodiment 1 which is devised will be described with reference to drawings.

<Circuit Configuration of Acceleration Sensor in Embodiment 1>

FIG. 2 is a diagram illustrating a schematic circuit configuration of an acceleration sensor according to the embodiment 1. As illustrated in FIG. 2, the acceleration sensor in the embodiment 1 has an input terminal IN1 and an input terminal IN2. A variable capacitor element VCAP1 and a variable capacitor element VCAP2 are connected in series between the input terminal IN1 and the input terminal IN2. Similarly, a variable capacitor element VCAP4 and a variable capacitor element VCAP3 are connected in series between the input terminal IN1 and the input terminal IN2.

At the time, the variable capacitor element VCAP1 and the variable capacitor element VCAP2 are configured such that electrostatic capacitances of the elements are changed by the acceleration applied from the outside and are MEMS capacitor formed of a micro electrical mechanical systems (MEMS) structure. Similarly, the variable capacitor element VCAP3 and the variable capacitor element VCAP4 are configured such that electrostatic capacitances of the elements are changed by the acceleration applied from the outside and are MEMS capacitor 2 formed of a MEMS structure.

Here, in a case where acceleration in a specific direction is applied to the acceleration sensor according to the embodiment 1, for example, in the MEMS capacitor 1, it is configured such that when the electrostatic capacitance of the variable capacitor element VCAP1 connected to the input terminal IN1 increases, the electrostatic capacitance of the variable capacitor element VCAP2 connected to the input terminal IN2 decreases. On the other hand, in the case, in the MEMS capacitor 2, it is configured such that when the electrostatic capacitance of the variable capacitor element VCAP4 connected to the input terminal IN1 decreases, and the electrostatic capacitance of the variable capacitor element VCAP3 connected to the input terminal IN2 increases.

That is, when attention is given to the MEMS capacitor 1, there are inverse characteristics between a change in the electrostatic capacitance of the variable capacitor element VCAP1 and a change in the electrostatic capacitance of the variable capacitor element VCAP2. Similarly, when attention is given also to the MEMS capacitor 2, there are inverse characteristics between a change in the electrostatic capacitance of the variable capacitor element VCAP3 and a change in the electrostatic capacitance of the variable capacitor element VCAP4. When attention is given to a relationship between the MEMS capacitor 1 and the MEMS capacitor 2, there are inverse characteristics between the change in the electrostatic capacitance of the variable capacitor element VCAP1 connected to the input terminal IN1 in the MEMS capacitor 1 and the change in the electrostatic capacitance of the variable capacitor element VCAP4 connected to the input terminal IN1 in the MEMS capacitor 2. Similarly, there are inverse characteristics between the change in the electrostatic capacitance of the variable capacitor element VCAP2 connected to the input terminal IN2 in the MEMS capacitor 1 and the change in the electrostatic capacitance of the variable capacitor element VCAP3 connected to the input terminal IN2 in the MEMS capacitor 2.

Next, as illustrated in FIG. 2, an intermediate node A between the variable capacitor element VCAP1 and the variable capacitor element VCAP2 configuring the MEMS capacitor 1 is connected to a CV conversion unit 10, and an intermediate node B between the variable capacitor element VCAP3 and the variable capacitor element VCAP4 configuring the MEMS capacitor 2 is connected to the CV conversion unit 10.

Specifically, the intermediate node A of the MEMS capacitor 1 is connected to, for example, the inverting input terminal of a charge amplifier CAMP1 configured to have a single end operational amplifier. A fixed potential VB (0.6 V) is applied to the non-inverting input terminal of the charge amplifier CAMP'. Further, a feedback capacitor element Cf1 and high resistance HR are connected in parallel between the inverting input terminal of the charge amplifier CAMP1 and an output terminal.

On the other hand, the intermediate node B of the MEMS capacitor 2 is connected to, for example, the inverting input terminal of a charge amplifier CAMP2 configured to have the single end operational amplifier. The fixed potential VB (0.6 V) is applied to the non-inverting input terminal of the charge amplifier CAMP2. Further, a feedback capacitor element Cf1 and high resistance HR are connected in parallel between the inverting input terminal of the charge amplifier CAMP2 and an output terminal.

As illustrated in FIG. 2, an AD conversion unit 11 for converting an analog signal into a digital signal is connected to the post-stage (output) of the CV conversion unit 10, and a differential detection unit 12 is connected to the post-stage (output) of the AD conversion unit 11. Further, a synchronous detection unit 13 is connected to the post-stage (output) of the differential detection unit 12, and a low pass filter (LPF) 14 is connected to the post-stage (output) of the synchronous detection unit 13. The LPF 14 is connected to an output terminal OUT.

<Operation of Acceleration Sensor According to Embodiment 1>

The acceleration sensor according to the embodiment 1 is configured as described above, and the operation thereof will be described below with reference to FIG. 2.

As illustrated in FIG. 2, modulation signals having the opposite phases with different phases by 180° are applied respectively to the input terminal IN1 and the input terminal IN2. For example, in principle, it is possible to detect acceleration without applying a modulation signal by detecting a capacitance change of a variable capacitor element caused by the acceleration. However, since a detection signal based on the capacitance change of the variable capacitor element corresponding to the acceleration is a low frequency signal, it is susceptible to an influence of the 1/f noise. That is, in a configuration that the detection signal based on the capacitance change of the variable capacitor element corresponding to the acceleration is used as it is, as the 1/f noise increases, the S/N ratio deteriorates and then the detection sensitivity of an acceleration sensor decreases. Therefore, the modulation signal is used in the embodiment 1. In the case, since the detection signal based on the capacitance change of the variable capacitor element corresponding to the acceleration is modulated by the modulation signal to be a high frequency signal, it is not susceptible to the 1/f noise. That is, since the 1/f noise is smaller in the high frequency signal than in the low frequency signal, as the S/N ratio is improved, the detection sensitivity of the acceleration sensor can be improved. For this reason, in the embodiment 1, the modulation signals are applied to the input terminal IN1 and the input terminal IN2.

The reason why the modulation signals having the opposite phases are applied to the input terminal IN1 and the input terminal IN2 will be described. In FIG. 2, when attention is given to the MEMS capacitor 1, it is assumed that the electrostatic capacitance of the variable capacitor element VCAP1 and the variable capacitor element VCAP2 is "C". In a case where the acceleration is applied, it is assumed that the electrostatic capacitance of the variable capacitor element VCAP1 increases to "C+ΔC" while the electrostatic capacitance of the variable capacitor element VCAP2 decreases to "C−ΔC". In such case, in the case where the modulation signals having the opposite phases are applied to the input terminal IN1 and the input terminal IN2, a charge of Q1=(C+ΔC) V is accumulated in the variable capacitor element VCAP1 while a charge of Q2=−(C−ΔC) V is accumulated in the variable capacitor element VCAP2. Accordingly, the amount of charge transfer in the MEMS capacitor 1 is (C+ΔC)V−(C−ΔC)V=2ΔCV. That is, in the case where the modulation signals having the opposite phases are applied to the input terminal IN1 and the input terminal IN2, cancellation occurs between the electrostatic capacitance "C" of the variable capacitor element VCAP1 and the electrostatic capacitance "C" of the variable capacitor element VCAP2, and only capacitance change (ΔC) component caused by the acceleration is included in the amount of charge transfer. As a result, in the amount of charge transfer, as the electrostatic capacitance "C" unrelated to the capacitance change (ΔC) caused by the acceleration is cancelled, since the amount of charge transfer according to the capacitance change (ΔC) is extracted, it is possible to improve the detection sensitivity of the acceleration sensor. For this reason, in the embodiment 1, it is configured such that the modulation signals having the opposite phases are applied to the input terminal IN1 and the input terminal IN2.

An operation of the acceleration sensor according to the embodiment 1 will be described based on the above premise. In FIG. 2, modulation signals having the opposite phases with different phases by 180° are applied respectively to the input terminal IN1 and the input terminal IN2. Here, when the acceleration is added, it is assumed that the electrostatic capacitance of the variable capacitor element VCAP1 of the MEMS capacitor 1 increases to "(C+ΔC)" while the electrostatic capacitance of the variable capacitor element VCAP2 of the MEMS capacitor 2 decrease to "(C−ΔC)". In the case, the electrostatic capacitance of the variable capacitor element VCAP4 of the MEMS capacitor 2 decrease to "(C−ΔC)" while the electrostatic capacitance of the variable capacitor element VCAP3 of the MEMS capacitor 2 increases to "(C+ΔC)".

As a result, the amount of charge transfer in the MEMS capacitor 1 is (C+ΔC)V−(C−ΔC) V=2ΔCV, and when electrostatic capacitance of the feedback capacitor element Cf1 is "Cf", a first analog voltage signal indicated by "2ΔCV/Cf" is output from the CV conversion unit 10.

Similarly, the amount of charge transfer in the MEMS capacitor 2 is (C−ΔC) V−(C+ΔC)V=−2ΔCV, and when electrostatic capacitance of the feedback capacitor element Cf1 is "Cf", a second analog voltage signal indicated by "−2ΔCV/Cf" is output from the CV conversion unit 10.

The first analog voltage signal is converted into a first digital voltage signal by the AD conversion unit 11, and the second analog voltage signal is converted into a second digital voltage signal by the AD conversion unit 11. Then, a difference between the first digital voltage signal and the second digital voltage signal is calculated by the differential detection unit 12, and a demodulation signal is extracted by the synchronous detection unit 13. The demodulation signal demodulated by the synchronous detection unit 13 passes through the low frequency band pass filter (LPF) 14 and finally an acceleration signal (detection signal) corresponding to the acceleration is output from the output terminal OUT.

As described above, according to the acceleration sensor in the embodiment 1, it is possible to detect the acceleration in the specific direction.

<Modification Example>

FIG. 3 is a diagram illustrating a modification example of the circuit configuration illustrated in FIG. 2. In FIG. 3, the fully differential operational amplifier FDAMP is used as the configuration element of the CV conversion unit 10. That is, in the circuit configuration illustrated in FIG. 2, the CV conversion unit 10 is configured to have the charge amplifier CAMP1 and the charge amplifier CAMP2 which are configured to have the single end operational amplifier. In contrast, in the circuit configuration illustrated in FIG. 3, the CV conversion unit 10 is configured to have one fully differential operational amplifier FDAMP. As described above, in the acceleration sensor according to the embodiment 1, it is possible to configure the CV conversion unit 10 from the circuit configuration illustrated in FIG. 2 but it is not limited thereto, the CV conversion unit 10 can be configured from the circuit configuration illustrated in FIG. 3.

Features According to Embodiment 1

Feature points of the embodiment 1 will be described. In FIG. 2, a first feature point according to the embodiment 1 is in that the MEMS capacitor 1 configured to have the variable capacitor element VCAP1 and the variable capacitor element VCAP2 is provided between the input terminal IN1 and the input terminal IN2, and the MEMS capacitor 2 configured to have the variable capacitor element VCAP3 and the variable capacitor element VCAP4 is provided therebetween. That is, in the acceleration sensor according to the embodiment 1, the feature point is in that there is provided two sets of MEMS capacitors (MEMS capacitor 1 and MEMS capacitor 2) configured to have the MEMS structure in which the electrostatic capacitance of the structure is changed due to the acceleration. Thereby, since the two sets of MEMS capacitors are configured to have the MEMS structure, any MEMS capacitor can be formed with fabrication accuracy of the MEMS structure. Accordingly, it is possible to reduce manufacturing variation between the two sets of MEMS capacitors. As a result, according to the acceleration sensor in the embodiment 1, it is possible to obtain the effect of reducing the adverse influence due to the external noise.

Hereinafter, this point will be described. For example, in the related art described above, as illustrated in FIG. 1, the MEMS capacitor and the fixed capacitor are formed between the input terminal IN1 and the input terminal IN2. In the case, the MEMS capacitor is configured to have the MEMS structure and formed with the fabrication accuracy of the MEMS structure while the fixed capacitor is formed on the semiconductor chip in which the integrated circuit is formed and formed with the fabrication accuracy of the CMOS process. Regarding this point, since there is a significant difference between the fabrication accuracy of the MEMS structure and the fabrication accuracy of the CMOS process, in the related art, the manufacturing variation (fabrication accuracy) of the MEMS capacitor and the fixed capacitor are significantly different.

Therefore, in the related art, for example, there is a difference between the electrostatic capacitance of the variable capacitor element VCAP1 and the electrostatic capacitance of the fixed capacitor element FCAP1 illustrated in FIG. 1 due to the difference in the fabrication accuracy between the MEMS capacitor and the fixed capacitor. Specifically, the electrostatic capacitance of the variable capacitor element VCAP1 becomes "C1" and the electrostatic capacitance of the fixed capacitor element FCAP1 becomes "C2". Under this circumstance, for example, when the external noise ($V_z$) is added to a modulation signal input to the input terminal IN1, the charge ($C1V_z$) caused by the external noise is added to the variable capacitor element VCAP1 while the charge ($C2V_z$) caused by the external noise is added to the fixed capacitor element FCAP1. At the time, since "C1" and "C2" are different from each other, there is a difference between the charge ($C1V_z$) added to the variable capacitor element VCAP1 and the charge ($C2V_z$) added to the fixed capacitor element FCAP1. That is, in the related art, as the manufacturing variation (fabrication accuracy) between the MEMS capacitor and the fixed capacitor increases due to the difference in the manufacturing methods of the MEMS capacitor and the fixed capacitor, the charge ($C1V_z$) caused by the external noise added to the variable capacitor element VCAP1 and the charge ($C2V_z$) caused by the external noise added to the fixed capacitor element FCAP1 are not cancelled completely even when the fixed capacitor is provided. This means, in the related art, that the external noise has the adverse influence on the output signal from the CV conversion unit 10. Accordingly, in the related art, it is impossible to sufficiently eliminate the influence of the external noise when considering the difference in the fabrication variation (difference in fabrication accuracy). When the influence of the external noise increases, the magnitude of the noise with respect to a signal increases. This means, in the related art, that the S/N ratio deteriorates, and the detection sensitivity of the acceleration decreases due to the deterioration thereof.

In contrast, in the acceleration sensor according to the embodiment 1, the two sets of the MEMS capacitors (MEMS capacitor 1 and MEMS capacitor 2) configured to have the MEMS structure are provided between the input terminal IN1 and the input terminal IN2 instead of providing the MEMS capacitor and the fixed capacitor therebetween as in the related art. Thereby, in the acceleration sensor according to the embodiment 1, since the two sets of MEMS capacitors are configured to have the MEMS structure, any MEMS capacitor can be formed with the fabrication accuracy of the MEMS structure. Accordingly, it is possible to reduce the manufacturing variation between the two sets of MEMS capacitors. That is, according to the embodiment 1, since the two sets of the MEMS capacitors (MEMS capacitor 1 and MEMS capacitor 2) formed by the technique with the same fabrication accuracy are employed instead of employing the MEMS capacitor and the fixed capacitor formed by the technique with significantly different fabrication accuracy as in the related art, the difference in the manufacturing variation between the two sets of the MEMS capacitors (MEMS capacitor 1 and MEMS capacitor 2) can be reduced.

For example, even when manufacturing variation in the MEMS capacitors occurs, since the technique with the same fabrication accuracy is used, it can be considered that the electrostatic capacitance thereof also deviates to the same degree in the two sets of the MEMS capacitors. In the case, the influence of the external noise is reduced. Specifically, since the technique with the same fabrication accuracy is used, for example, even when a deviation from a design value of the electrostatic capacitance occurs, it is considered that the same degree of deviation occurs. That is, for example, in a case where the electrostatic capacitance of the variable capacitor element VCAP1 is changed from a design value "C" to "C1", it is assumed that the electrostatic capacitance of the variable capacitor element VCAP4 is changed also from the design value "C" to the same "C1". Under this circumstance, when the external noise ($V_z$) is added to a modulation signal input to the input terminal IN1, the charge ($C1V_z$) caused by the external noise is added to the variable capacitor element VCAP1 while the charge ($C1V_z$) caused by the external noise is added to the variable capacitor element VCAP4. At the time, since the electrostatic capacitance of the variable capacitor element VCAP1 "C1" is equal to the electrostatic capacitance of the variable capacitor element VCAP4 "C1", the charge (C1Vz) added to the variable capacitor element VCAP1 is equal to the charge (C1Vz) added to the variable capacitor element VCAP4. That is, in the embodiment 1, the manufacturing technique with the same fabrication accuracy is used for fabricating the two sets of the MEMS capacitors (MEMS capacitor 1 and MEMS capacitor 2) to reduce the manufacturing variation (fabrication accuracy) between the two sets of the MEMS capacitors. As a result, according to the acceleration sensor in the embodiment 1, under the circumstance where the electrostatic capacitance value deviates from the design value, even when the external noise ($V_z$) is added, an output signal component based on the charge ($C1V_z$) caused by the external noise added to the variable capacitor element VCAP1 and an output signal component based on the charge ($C1V_z$) caused by the external noise added to the variable capacitor element VCAP4 are cancelled. This means, in the embodiment 1, that the influence of the external noise can be reduced.

Accordingly, in the acceleration sensor according to the embodiment 1, it is possible to sufficiently eliminate the influence of the external noise even when the fabrication variation exists. In other words, according to the embodiment 1, it can be said that it is possible to provide the excellent acceleration sensor with high resistance to the external noise. The decrease in the influence of the external noise means the decrease in the magnitude of the noise with respect to a signal. Thereby, according to the embodiment 1, it is possible to realize the high sensitivity acceleration sensor with high S/N ratio.

Next, a second feature point according to the embodiment 1 is, as illustrated in FIG. 2, in that the two sets of the MEMS capacitors (MEMS capacitor 1 and MEMS capacitor 2) are provided to increase the signal output from the CV conversion unit 10.

For example, in FIG. 2, it is considered that a case where the fixed capacitor (refer to FIG. 1) is provided between the input terminal IN1 and the input terminal IN2 instead of the MEMS capacitor 1 and the MEMS capacitor 2. In the case, when the acceleration is applied, electrostatic capacitance of the MEMS capacitor 1 changes. Specifically, for example, the electrostatic capacitance of the variable capacitor element VCAP1 becomes "C+$\Delta$C", and the electrostatic capacitance of the variable capacitor element VCAP2 becomes "C−$\Delta$C". As a result, the amount of charge transfer of (C+$\Delta$C)V−(C−$\Delta$C)V=2$\Delta$CV occurs in the entire MEMS capacitor 1. Thereby, when the electrostatic capacitance of the feedback capacitor element is "Cf", a first output signal (first voltage signal) of 2$\Delta$CV/Cf is output from the CV conversion unit 10. On the other hand, even when the acceleration is applied, the electrostatic capacitance of the fixed capacitor is not changed. As a result, the amount of charge transfer of the fixed capacitor is "0". Thereby, when the electrostatic capacitance of the feedback capacitor element is "Cf", a second output signal (second voltage signal) of "0" is output from the CV conversion unit 10. Therefore, in the case where the fixed capacitor instead of the MEMS capacitor 2 is used, the first output signal−the second output signal=2$\Delta$CV/Cf.

In contrast, in the embodiment 1, as illustrated in FIG. 2, the MEMS capacitor 1 and the MEMS capacitor 2 are provided between the input terminal IN1 and the input terminal IN2. In the case, when the acceleration is applied, a change in the electrostatic capacitance of the MEMS capacitor 1 occurs. Specifically, for example, the electrostatic capacitance of the variable capacitor element VCAP1 becomes "C+$\Delta$C" and the electrostatic capacitance of the variable capacitor element VCAP2 becomes "C−$\Delta$C". As a result, the amount of charge transfer of (C+$\Delta$C)V−(C−$\Delta$C)V=2$\Delta$CV occurs in the entire MEMS capacitor 1. Thereby, when the electrostatic capacitance of the feedback capacitor element is "Cf", the first output signal (first voltage signal) of 2$\Delta$CV/Cf is output from the CV conversion unit 10. Similarly, electrostatic capacitance of the MEMS capacitor 2 also changes. Specifically, for example, the electrostatic capacitance of the variable capacitor element VCAP4 becomes "C−$\Delta$C" and the electrostatic capacitance of the variable capacitor element VCAP3 becomes "C+$\Delta$C". As a result, the amount of charge transfer of (C−$\Delta$C)V−(C+$\Delta$C) V=2$\Delta$CV occurs in the entire MEMS capacitor 2. Thereby, when the electrostatic capacitance of the feedback capacitor element is "Cf", the second output signal (second voltage signal) of −2$\Delta$CV/Cf is output from the CV conversion unit 10. Therefore, as in the embodiment 1, in the case where the two sets of the MEMS capacitors (MEMS capacitor 1 and MEMS capacitor 2) are provided, the first output signal−the second output signal=4$\Delta$CV/Cf.

Therefore, according to the acceleration sensor in the embodiment 1, the magnitude of the signal (the first output signal−the second output signal) output from the CV conversion unit 10 increases compared with the case where the fixed capacitor is provided instead of the MEMS capacitor 2. This means, according to the embodiment 1, that the output signal (signal) caused by the acceleration increases. Thereby, it is possible to increase the S/N ratio.

As described above, according to the acceleration sensor in the embodiment 1, it is possible to improve the S/N ratio by a synergistic effect of the point that the external noise can be reduced by the first feature point described above and the point that the magnitude of the signal can be increased by the second feature point described above. As a result, according to the embodiment 1, it is possible to realize the high sensitivity acceleration sensor with high S/N ratio.

In the embodiment 1, the manufacturing technique with the same fabrication accuracy is used for fabricating the two sets of the MEMS capacitors (MEMS capacitor 1 and MEMS capacitor 2) to reduce the manufacturing variation (fabrication accuracy) between the two sets of the MEMS capacitors. Further, in the embodiment 1, contrivance is devised for a device structure of a MEMS structure (sensor element) in which the MEMS capacitor 1 and the MEMS capacitor 2 are formed in order to reduce the fabrication variation of the two sets of the MEMS capacitors (MEMS capacitor 1 and MEMS capacitor 2). Hereinafter, first, the device structure of the sensor element in which the two sets of the MEMS capacitors (MEMS capacitor 1 and MEMS capacitor 2) are formed will be described and then feature points of the device structure of the sensor element according to the embodiment 1 will be described.

<Device Structure of Sensor Element According to Embodiment 1>

FIG. 4 is a cross-sectional view illustrating a device structure of a sensor element SE of the acceleration sensor according to the embodiment 1. In FIG. 4, the sensor element SE according to the embodiment 1 includes a mass body MS which is displaced with respect to the acceleration in the z direction. The mass body MS includes a variable unit VU1, a variable unit VU2 separated electrically from the variable unit VU1, and a mechanical connection unit MCU mechanically connecting the variable unit VU1 and the variable unit VU2.

The mass body MS is formed in an SOI layer configured to have an insulation layer IL, a conductor layer CL1 formed on the surface of the insulation layer IL, and a conductor layer CL2 formed on the back surface of the insulation layer IL. For example, the conductor layer CL1 and the conductor layer CL2 are formed from a semiconductor layer made of silicon, and the insulation layer IL is formed of a silicon oxide film.

Specifically, the variable unit VU1 includes a variable electrode VEL1 formed by fabricating the conductor layer CL1 and a variable electrode VEL2 formed by fabricating the conductor layer CL2. That is, the insulation layer IL is formed so as to be sandwiched between the variable electrode VEL1 and the variable electrode VEL2, and the variable electrode VEL1 and the variable electrode VEL2 are connected electrically by a plug PLG1 penetrating the insulation layer IL.

Similarly, the variable unit VU2 includes a variable electrode VEL3 formed by fabricating the conductor layer CL1 and a variable electrode VEL4 formed by fabricating the conductor layer CL2. That is, the insulation layer IL is formed so as to be sandwiched between the variable electrode VEL3 and the variable electrode VEL4, and the variable electrode VEL3 and the variable electrode VEL4 are connected electrically by a plug PLG2 penetrating the insulation layer IL.

In the conductor layer CL1 of the SOI layer, a part of the conductor layer CL1 is removed by etching to form a separation unit ISU1. Thereby, the variable electrode VEL1 of the variable unit VU1 formed in the conductor layer CL1 and the variable electrode VEL3 of the variable unit VU2 formed in the conductor layer CL1 are separated by the separation unit ISU1.

On the other hand, in the conductor layer CL2 of the SOI layer, a part of the conductor layer CL2 is removed by etching to form a separation unit ISU2 and a separation unit ISU3. Thereby, the variable electrode VEL2 of the variable unit VU1 formed in the conductor layer CL2 and the variable electrode VEL4 of the variable unit VU2 formed in the conductor layer CL2 are separated by the separation unit ISU2 and the separation unit ISU3. In the conductor layer CL2 of the SOI layer, the mechanical connection unit MCU formed by the conductor layer CL2 is formed so as to be sandwiched between the separation unit ISU2 and the separation unit ISU3. Thereby, the variable unit VU1 and the variable unit VU2 formed in the SOI layer are connected mechanically by the mechanical connection unit MCU while being separated electrically by the separation unit ISU1, the separation unit ISU2, and the separation unit ISU3. At the time, as illustrated in FIG. 4, in a cross-sectional view, the separation unit ISU1 is formed on the mechanical connection unit MCU, and the mechanical connection unit MCU includes the separation unit ISU1. The mechanical connection unit MCU is provided so as to be sandwiched between the separation unit ISU2 and the separation unit ISU3. The mechanical connection unit MCU mechanically connects the variable unit VU1 and the variable unit VU2 separated in the x direction orthogonal to the z direction.

As illustrated in FIG. 4, in the sensor element SE according to the embodiment 1, a fixed unit FU configured to have a cap unit and a base unit is formed so as to surround the SOI layer in which the variable unit VU1, the variable unit VU2, and the mechanical connection unit MCU are formed through a space. A fixed electrode FEL1, a fixed electrode FEL2, a fixed electrode FEL3, and a fixed electrode FEL4 are formed in the fixed unit. Specifically, as illustrated in FIG. 4, the fixed electrode FEL1 is disposed in the cap unit of the fixed unit FU so as to face the variable electrode VEL1 of the variable unit VU1, and the fixed electrode FEL2 is disposed in the base unit of the fixed unit FU so as to face the variable electrode VEL2 of the variable unit VU1. Similarly, the fixed electrode FEL3 is disposed in the cap unit of the fixed unit FU so as to face the variable electrode VEL3 of the variable unit VU2, and the fixed electrode FEL4 is disposed in the base unit of the fixed unit FU so as to face the variable electrode VEL4 of the variable unit VU2. Thereby, in the sensor element SE according to the embodiment 1, the variable capacitor element VCAP1 is formed by the variable unit VU1 and the fixed electrode FEL1, and the variable capacitor element VCAP2 is formed by the variable unit VU1 and the fixed electrode FEL2. Similarly, the variable capacitor element VCAP3 is formed by the variable unit VU2 and the fixed electrode FEL3, and the variable capacitor element VCAP4 is formed by the variable unit VU2 and the fixed electrode FEL4.

Here, in the sensor element SE according to the embodiment 1, in a case where the mass body MS is displaced in the z direction, the electrostatic capacitance of one variable capacitor element increases while the electrostatic capacitance of the other variable capacitor element decrease of the variable capacitor element VCAP1 and the variable capacitor element VCAP2. Similarly, the electrostatic capacitance of one variable capacitor element increases while the electrostatic capacitance of the other variable capacitor element decrease of the variable capacitor element VCAP3 and the variable capacitor element VCAP4.

For example, in FIG. 4, in a case where the mass body MS is displaced in the +z direction, since a distance between the variable electrode VEL1 configuring the variable capacitor element VCAP1 and the fixed electrode FEL1 is narrowed, the electrostatic capacitance of the variable capacitor element VCAP1 increases while since a distance between the variable electrode VEL2 configuring the variable capacitor element VCAP2 and the fixed electrode FEL2 is widened, the electrostatic capacitance of the variable capacitor element VCAP2 decreases. Similarly, in FIG. 4, in the case where the mass body MS is displaced in the +z direction, since a distance between the variable electrode VEL3 configuring the variable capacitor element VCAP3 and the fixed electrode FEL3 is narrowed, the electrostatic capacitance of the variable capacitor element VCAP3 increases while since a distance between the variable electrode VEL4 configuring the variable capacitor element VCAP4 and the fixed electrode FEL4 is widened, the electrostatic capacitance of the variable capacitor element VCAP4 decreases. As described above, in the sensor element SE according to the embodiment 1, the mass body MS including the variable unit VU1 and the variable unit VU2 which are separated electrically from each other and connected mechanically to each other is formed by fabricating the same SOI layer.

As can be seen from FIGS. 2 and 4, the fixed electrode FEL1 and the fixed electrode FEL4 illustrated in FIG. 4 are connected electrically and connected to the input terminal IN1 illustrated in FIG. 2. On the other hand, the fixed electrode FEL2 and the fixed electrode FEL3 illustrated in FIG. 4 are connected electrically and connected to the input terminal IN2 illustrated in FIG. 2. As a result, from FIGS. 2 and 4, voltage signals having the opposite phases are input to the fixed electrode FEL1 connected to the input terminal IN1 and the fixed electrode FEL2 connected to the input terminal IN2. Similarly, voltage signals having the opposite phases are input to the fixed electrode FEL4 connected to the input terminal IN1 and the fixed electrode FEL3 connected to the input terminal IN2. Further, not illustrated in FIG. 4, the variable unit VU1 is connected electrically to a first output unit (intermediate node A in FIG. 2), and the variable unit VU2 is connected electrically to a second output unit (intermediate node B in FIG. 2). In FIG. 2, the first output unit is connected to the inverting input terminal of the charge amplifier CAMP1 of the CV conversion unit 10, the second output unit is connected to the inverting input terminal of the charge amplifier CAMP2 of the CV conversion unit 10.

As described above, the sensor element SE according to the embodiment 1 is configured. Hereinafter, feature points of the sensor element SE according to the embodiment 1 configured as mentioned above will be described.

<Features of Sensor Element According to Embodiment 1>

A first feature point of the sensor element SE according to the embodiment 1 is in that the variable unit VU1 and the variable unit VU2 configuring the mass body MS are formed by fabricating the same SOI layer on the premise of using the manufacturing technique of the MEMS structure. Thereby, first, based on the premise, since both the variable unit VU1 and the variable unit VU2 are formed as the MEMS structure, the manufacturing variation (fabrication accuracy) between the variable unit VU1 and the variable unit VU2 can be reduced. Further, in the sensor element SE according to the embodiment 1, the variable unit VU1 and the variable unit VU2 are formed by fabricating the same SOI layer. Accordingly, it is possible to further reduce the manufacturing variation between the variable unit VU1 and the variable unit VU2 compared with a case where the variable unit VU1 and the variable unit VU2 are formed by fabricating separate layers. This is the first feature point of the sensor element SE according to the embodiment 1. According to the embodiment 1, it is possible to reduce the manufacturing variation between the variable unit VU1 and the variable unit VU2 by a synergistic effect of the premise and the first feature point described above. As a result, according to the embodiment 1, for example, it is possible to suppress the deviation ("mismatch") between the electrostatic capacitance of the MEMS capacitor 1 and the electrostatic capacitance of the MEMS capacitor 2 illustrated in FIG. 2.

A second feature point of the sensor element SE according to the embodiment 1 is in that on the premise of the first feature point in which the variable unit VU1 and the variable unit VU2 are formed in the same SOI layer, further, the variable unit VU1 and the variable unit VU2 are connected mechanically by the mechanical connection unit MCU while being separated electrically from each other. Thereby, according to the sensor element SE in the embodiment 1, it is possible to further suppress the deviation ("mismatch") between the electrostatic capacitance of the MEMS capacitor 1 and the electrostatic capacitance of the MEMS capacitor 2 illustrated in FIG. 2.

For example, as illustrated in FIG. 4, in the case where the variable unit VU1 and the variable unit VU2 are connected by the mechanical connection unit MCU, the variable unit VU1 and the variable unit VU2 are formed mechanically and integrally even while being separated electrically from each other. In FIG. 4, this means that the variable unit VU1 and the variable unit VU2 are formed such that the distance between the variable electrode VEL1 of the variable unit VU1 and the fixed electrode FEL1 is substantially equal to the distance between the variable electrode VEL3 of the variable unit VU2 and the fixed electrode FEL3. In other words, in FIG. 4, this means that the variable unit VU1 and the variable unit VU2 are formed such that the distance between the variable electrode VEL2 of the variable unit VU1 and the fixed electrode FEL2 is substantially equal to the distance between the variable electrode VEL4 of the variable unit VU2 and the fixed electrode FEL4.

Therefore, according to the sensor element SE in the embodiment 1, the electrostatic capacitance of the variable capacitor element VCAP1 and the electrostatic capacitance of the variable capacitor element VCAP3 can be made substantially equal to each other, and the electrostatic capacitance of the variable capacitor element VCAP2 and the electrostatic capacitance of the variable capacitor element VCAP4 can be made substantially equal to each other. Thereby, according to the embodiment 1, for example, it is possible to significantly suppress the deviation ("mismatch") between the electrostatic capacitance of the MEMS capacitor 1 and the electrostatic capacitance of the MEMS capacitor 2 illustrated in FIG. 2 by a synergistic effect of the premise, the first feature point, and the second feature point described above.

As described above, according to the embodiment 1, there is the devised point (refer to FIG. 2) on the circuit configuration that the two sets of the MEMS capacitors (MEMS capacitor 1 and MEMS capacitor 2) are provided between the input terminal IN1 and the input terminal IN2 and the devised point (refer to FIG. 4) on the device structure that the variable unit VU1 and the variable unit VU2 formed in the same SOI layer are connected mechanically by the mechanical connection unit MCU while being separated electrically from each other. As a result, according to the embodiment 1, it is possible to realize the high sensitivity acceleration sensor with high S/N ratio by a synergistic effect of the devised point on the circuit configuration and the devised point on the device structure.

Embodiment 2

Next, an acceleration sensor according to embodiment 2 will be described. FIG. 5 is a diagram illustrating one example of a schematic configuration of the acceleration sensor according to the embodiment 2. In FIG. 5, the acceleration sensor according to the embodiment 2 is configured to have a sensor element for detecting the acceleration and an electronic circuit for processing an electrical signal output from the sensor element. At the time, the sensor element is configured to have a micro electro mechanical systems (MEMS) structure, the electronic circuit is configured to have an application specific integrated circuit (ASIC). Hereinafter, the MEMS structure and the ASIC configuring the acceleration sensor according to the embodiment 2 will be described.

<Configuration of MEMS Structure (Sensor Element)>

As illustrated in FIG. 5, the MEMS structure is configured to have the sensor element including a fixed unit fixed to a frame body and a mass body MS displaceable in a predetermined direction, and a detection capacitor unit that captures the acceleration as a change of electrostatic capacitance is formed in the sensor element. Specifically, the detection capacitor unit is configured to have a pair of capacitors including a variable capacitor element VCAP1 and a variable capacitor element VCAP2 and another pair of capacitors including a variable capacitor element VCAP3 and a variable capacitor element VCAP4. At the time, for example, in FIG. 5, the variable capacitor element VCAP1 and the variable capacitor element VCAP2 are configured such that the electrostatic capacitance of one variable capacitor element increases while the electrostatic capacitance of the other variable capacitor element decreases with respect to displacement of the mass body MS in a predetermined direction. Similarly, the variable capacitor element VCAP3 and the variable capacitor element VCAP4 are configured such that the electrostatic capacitance of one variable capacitor element increases while the electrostatic capacitance of the other variable capacitor element decreases with respect to displacement of the mass body MS in a predetermined direction. This configuration is similar to that of the embodiment 1, and two sets of capacitor pairs in which the electrostatic capacitance of the capacitor is changed due to the acceleration are provided also in the embodiment 2. Thereby, since two sets of capacitor pairs are configured to have the MEMS structure, any set of capacitor pair can be formed with fabrication accuracy of the MEMS structure. Therefore, it is possible to reduce manufacturing variation between the two sets of capacitors pair. As a result, according to the acceleration sensor in the embodiment 2, it is possible to obtain the effect of reducing the adverse influence due to the external noise by the reason described in the embodiment 1.

Further, also in the embodiment 2, similarly to the embodiment 1, the two sets of capacitor pairs are provided, and a first modulation signal having the same phase is applied to the variable capacitor element VCAP1 which is a configuration element of one set of capacitor pair and the variable capacitor element VCAP4 which is a configuration element of another set of capacitor pair. A second modulation signal having a phase opposite to that of the first modulation signal described above is applied to the variable capacitor element VCAP2 which is another configuration element of the one set of capacitor pair and the variable capacitor element VCAP3 which is another configuration element of another one set of capacitor pair. Thereby, also in the embodiment 2, it is possible to increase an electrical signal (signal) corresponding to the acceleration by the reason described in the embodiment 1.

As described above, according to also the acceleration sensor in the embodiment 2, similarly to the embodiment 1, it is possible to obtain the synergistic effect of the point that the external noise can be reduced and the point that the magnitude of signal (electrical signal) can be increased. Thereby, the S/N ratio can be improved. As a result, also in the embodiment 2, it is possible to realize the high sensitivity acceleration sensor with high S/N ratio.

In the sensor element according to the embodiment 2, there is formed a servo capacitor unit to which a servo voltage generating electrostatic force that cancels the displacement of the mass body MS caused by the acceleration is applied. In other words, it can be said that the servo capacitor unit has a function of generating the electrostatic force that cancels the change in the electrostatic capacitance of the detection capacitor unit by applying the servo voltage. At the time, the servo voltage includes a DC voltage component and an AC voltage component, for example, the DC voltage component is a component that cancels gravitational acceleration, and the AC voltage component is a component that cancels infinitesimal vibration acceleration. In correspondence with the fact that the servo voltage is configured to have the DC voltage component and the AC voltage component, the servo capacitor unit according to the embodiment 2 is configured to have a capacitor unit to which the DC voltage component of the servo voltage is applied and a capacitor unit to which the AC voltage component of the servo voltage is applied. Specifically, the servo capacitor unit according to the embodiment 2 has one set of DC servo capacitor pair configured to have a DC voltage applying servo capacitor element DCS1 and a DC voltage applying servo capacitor element DCS2, and another set of the DC servo capacitor pair configured to have a DC voltage applying servo capacitor element DCS3 and a DC voltage applying servo capacitor element DCS4. Further, the servo capacitor unit according to the embodiment 2 has one set of AC servo capacitor pair configured to have an AC voltage applying servo capacitor element ACS1 and an AC voltage applying servo capacitor element ACS2, and another set of the AC servo capacitor pair configured to have an AC voltage applying servo capacitor element ACS3 and an AC voltage applying servo capacitor element ACS4. That is, in the sensor element according to the embodiment 2, there is formed the servo capacitor unit configured to have the two sets of the DC servo capacitor pairs and the two sets of the AC servo capacitor pairs.

In the sensor element according to the embodiment 2 as described above, the servo capacitor unit is formed, and it is configured such that the displacement of the mass body MS based on the acceleration is cancelled by coulomb force (electrostatic force) generated by applying the servo voltage to the servo capacitor unit. Thereby, even when the acceleration is applied to the sensor element, there is substantially no displacement in the mass body MS. However, since a servo voltage proportional to the magnitude of the acceleration is applied to the servo capacitor unit, as a result, the acceleration applied to the sensor element can be detected by outputting the servo voltage.

The advantage of providing the servo capacitor unit is that the acceleration can be detected without the displacement of the mass body MS. That is, with a servo mechanism by the servo capacitor unit, in a case where large acceleration is applied to the sensor element, it is possible to prevent the mass body MS and the frame body from contacting each other due to unexpected displacement of the mass body MS.

The sensor element including the MEMS structure is configured as described above, and a configuration of the ASIC electrically connected to the sensor element will be described below.

<Configuration of ASIC>

In FIG. 5, the ASIC according to the embodiment 2 has drivers DRV1 and DRV2, charge amplifiers 101a and 101b, an amplifier 102, an analog filter 103, an A/D converter 104, a DC servo control unit 105, a demodulator 106, an AC servo control unit 107, a one bit quantizer 108, a one bit D/A converter 109, and a low pass filter (DLPF) 110.

The driver DRV1 is connected electrically to the variable capacitor element VCAP1 and the variable capacitor element VCAP4 of the sensor element, and is configured such that the first modulation signal having the same phase is applied to the variable capacitor element VCAP1 and the variable capacitor element VCAP4 based on a modulation clock. On the other hand, the driver DRV2 is connected electrically to the variable capacitor element VCAP2 and the variable capacitor element VCAP3 of the sensor element, and is configured such that the second modulation signal having the phase opposite to that of the first modulation signal is applied to the variable capacitor element VCAP2 and the variable capacitor element VCAP3 based on a modulation clock having the opposite phase.

The charge amplifier 101a is configured to have an operational amplifier, and a feedback capacitor and a high resistance element connected in parallel between the input and output of the operational amplifier and the charge amplifier 101a configures a C/V conversion unit (capacitance/voltage conversion unit). Specifically, the charge amplifier 101a is connected electrically to the variable capacitor element VCAP1 and the variable capacitor element VCAP2 of the sensor element and has a function of converting changes in electrostatic capacitance (2ΔC) of the variable capacitor element VCAP1 and the variable capacitor element VCAP2 into a voltage signal of a voltage value (2ΔCV/Cf).

Similarly, the charge amplifier 101b is configured to have an operational amplifier, and a feedback capacitor and a high resistance element connected in parallel between the input and output of the operational amplifier and the charge amplifier 101b configures a C/V conversion unit. Specifically, the charge amplifier 101b is connected electrically to the variable capacitor element VCAP3 and the variable capacitor element VCAP4 of the sensor element and has a function of converting changes in electrostatic capacitance (−2ΔC) of the variable capacitor element VCAP3 and the variable capacitor element VCAP4 into a voltage signal of a voltage value (−2ΔCV/Cf).

Next, the input of the amplifier 102 is connected electrically to the charge amplifier 101a and the charge amplifier 101b, and the amplifier 102 has a function of outputting a differential between the voltage signal of the voltage value (2ΔCV/Cf) output from the charge amplifier 101a and the voltage signal of the voltage value (−2ΔCV/Cf) output from the charge amplifier 101b. Accordingly, a voltage signal based on voltage value (2ΔCV/Cf)−voltage value (−2ΔCV/Cf)=differential voltage value (4ΔCV/Cf) is output from the amplifier 102.

The analog filter 103 has a function of removing a noise component included in the voltage signal of the differential voltage value (4ΔCV/Cf) output from the amplifier 102. The A/D conversion unit 104 has a function of converting the voltage signal (analog signal) in which the noise component is removed by the analog filter 103 into a voltage signal (digital signal).

The DC servo control unit 105 is configured to receive the voltage signal (digital signal) converted by the A/D conversion unit 104, to determine the DC voltage component of the servo voltage applied to the two sets of the DC servo capacitor pairs (DC voltage applying servo capacitor elements DCS1, DCS2, DCS3, and DCS4) of the sensor element, and to apply the determined DC voltage component of the servo voltage to the two sets of the DC servo capacitor pairs. Thereby, the electrostatic force that cancels the gravitational acceleration is generated in each of the two sets of the DC servo capacitor pairs.

On the other hand, the demodulator 106 has a function of demodulating the voltage signal (digital signal) received from the A/D conversion unit 104 by receiving the voltage signal (digital signal) converted by the A/D converter 104 and the modulation clock. Thereby, a signal corresponding to the infinitesimal vibration acceleration is extracted from the voltage signal (digital signal) received from the A/D conversion unit 104. The AC servo control unit 107 is configured to receive the signal corresponding to the infinitesimal vibration acceleration demodulated by the demodulator 106 and to determine the AC voltage component of the servo voltage applied to the two sets of the AC servo capacitor pairs (AC voltage applying servo capacitor elements ACS1, ACS2, ACS3, and ACS4) of the sensor element.

Next, the one bit quantizer 108 has a function of quantizing the AC voltage component of the servo voltage determined by the AC servo control unit 107 to one bit. Here, the output of the one bit quantizer 108 is output to the low pass filter (DLPF) 110, and a high frequency component (quantization error) is removed from the AC voltage component of the servo voltage quantized to one bit by the low pass filter 110. Thereby, the AC voltage component of the servo voltage quantized to one bit is finally output from the acceleration sensor, the infinitesimal vibration acceleration applied to the sensor element is calculated based on the output.

The output of the one bit quantizer 108 is input to the one bit D/A converter 109. The one bit D/A converter 109 is configured to convert the AC voltage component of the servo voltage quantized to one bit by the one bit quantizer 108 into an analog voltage (for example, ±5 V or 0 V/10 V) and to apply the analog voltage to the two sets of the AC servo capacitor pairs (AC voltage applying servo capacitor elements ACS1, ACS2, ACS3, and ACS4). Thereby, the electrostatic force that cancels the infinitesimal vibration acceleration is generated in each of the two sets of the AC servo capacitor pairs. As described above, the servo mechanism in which the electrostatic force that cancels the acceleration (gravitational acceleration+infinitesimal vibration acceleration) applied to the sensor element is added to the mass body MS of the sensor element works, so that the displacement of the mass body MS caused by the acceleration is suppressed.

<Operation of Acceleration Sensor>

The acceleration sensor according to the embodiment 2 is configured as described above, and an operation thereof will be described below with reference to FIG. 5.

The first modulation signal having the same phase is applied to the variable capacitor element VCAP1 and the variable capacitor element VCAP4 of the sensor element by the driver DRV1. On the other hand, the second modulation signal having the phase opposite to that of the first modulation signal is applied to the variable capacitor element VCAP2 and the variable capacitor element VCAP3 of the sensor element by the driver DRV2.

In this state, it is assumed that the acceleration is applied to the sensor element. In the case, the mass body MS which is a configuration element of the sensor element is displaced by the acceleration applied to the sensor element. As a result, the change in each electrostatic capacitance of the variable capacitor elements VCAP1 to VCAP4 of the sensor element occurs.

Specifically, in a capacitor pair configured to have the variable capacitor element VCAP1 and the variable capacitor element VCAP2, in a case where a change in electrostatic capacitance of the variable capacitor element VCAP1 is +ΔC, a change in electrostatic capacitance of the variable capacitor element VCAP2 is −ΔC. When it is considered that the first modulation signal is applied to the variable capacitor element VCAP1, and the second modulation signal having the phase opposite to that of the first modulation signal is applied to the variable capacitor element VCAP2, in the entire capacitor pair configured to have the variable capacitor element VCAP1 and the variable capacitor element VCAP2, a change in electrostatic capacitance of ΔC−(−SC)=2ΔC occurs.

On the other hand, in a capacitor pair configured to have the variable capacitor element VCAP3 and the variable capacitor element VCAP4, a change in electrostatic capacitance of the variable capacitor element VCAP3 is +ΔC, and a change in electrostatic capacitance of the variable capacitor element VCAP4 is +ΔC. When it is considered that the second modulation signal is applied to the variable capacitor element VCAP3, and the first modulation signal having the phase opposite to that of the second modulation signal is applied to the variable capacitor element VCAP4, in the entire capacitor pair configured to have the variable capacitor element VCAP3 and the variable capacitor element VCAP4, a change in electrostatic capacitance of −ΔC−(+ΔC)=2ΔC occurs.

Next, the change in the electrostatic capacitance (2ΔC) of the capacitor pair configured to have the variable capacitor element VCAP1 and the variable capacitor element VCAP2 is converted into the voltage signal of the voltage value (2ΔCV/Cf) by the charge amplifier 101a. Similarly, the change in the electrostatic capacitance (−2ΔC) of the capacitor pair configured to have the variable capacitor element VCAP3 and the variable capacitor element VCAP4 is converted into the voltage signal of the voltage value (−2ΔCV/Cf) by the charge amplifier 101b.

Then, a differential between the voltage signal of the voltage value (2ΔCV/Cf) and the voltage signal of the voltage value (−2ΔCV/Cf) is obtained by the amplifier 102, and the voltage signal of the voltage value (4ΔCV/Cf) is output from the amplifier 102. The voltage signal output from the amplifier 102 is input to the analog filter 103 and the noise component thereof is removed. The voltage signal from which the noise component is removed by the analog filter 103 is converted into the digital voltage signal by the A/D converter 104.

The digital voltage signal is input to the DC servo control unit 105. In the DC servo control unit 105, the DC voltage component of the servo voltage applied to the two sets of the DC servo capacitor pairs (DC voltage applying servo capacitor elements DCS1, DCS2, DCS3, and DCS4) of the sensor element is determined and the determined DC voltage component of the servo voltage is applied to the two sets of the DC servo capacitor pairs. Thereby, the electrostatic force that cancels the gravitational acceleration is generated in each of the two sets of the DC servo capacitor pairs.

The digital voltage signal A/D converted by the A/D converter 104 is input to the demodulator 106, and in the demodulator 106, demodulation processing of the digital voltage signal is performed based on the digital voltage signal and the modulation clock. Thereby, a signal corresponding to the infinitesimal vibration acceleration is extracted from the digital voltage signal received from the A/D conversion unit 104. The AC servo control unit 107 receives the signal corresponding to the infinitesimal vibration acceleration and determines the AC voltage component of the servo voltage applied to the two sets of the AC servo capacitor pairs (AC voltage applying servo capacitor elements ACS1, ACS2, ACS3, and ACS4) of the sensor element by the AC servo control unit 107.

Then, the AC voltage component of the servo voltage determined by the AC servo control unit 107 is quantized to one bit by the one bit quantizer 108. The output of the one bit quantizer 108 is output to the low pass filter (DLPF) 110 and the high frequency component (quantization error) is removed from the AC voltage component of the servo voltage quantized to one bit by the low pass filter 110. Thereby, the AC voltage component of the servo voltage quantized to one bit is output from the acceleration sensor finally, and the infinitesimal vibration acceleration applied to the sensor element is calculated based on the output.

The output of the one bit quantizer 108 is input to the one bit D/A converter 109. The AC voltage component of the servo voltage quantized to one bit is converted into the analog voltage (for example, ±5 V or 0 V/10 V) by the one bit D/A converter 109. The analog voltage is applied to the two sets of the AC servo capacitor pairs (AC voltage applying servo capacitor elements ACS1, ACS2, ACS3, and ACS4).

As described above, the electrostatic force that cancels the infinitesimal vibration acceleration is generated in each of the two sets of the AC servo capacitor pairs. As a result, the electrostatic force that cancels the acceleration (gravitational acceleration+infinitesimal vibration acceleration) applied to the sensor element is added to the mass body MS of the sensor element, so that the displacement of the mass body MS caused by the acceleration is suppressed.

As described above, according to the acceleration sensor in the embodiment 2, a servo operation applying the servo voltage to the servo capacitor unit is performed while a detection operation that captures the acceleration as the change of the electrostatic capacitance is performed by the detection capacitor unit of the sensor element. That is, according to the acceleration sensor in the embodiment 2, it is possible to simultaneously operate the detection operation of the acceleration and the servo operation that cancels the displacement of the mass body MS.

Features According to Embodiment 2

Next, feature points according to the embodiment 2 will be described. A first feature point according to the embodiment 2 is in that the detection capacitor unit (variable capacitor elements VCAP1 to VCAP4) is provided in the mass body MS and the servo capacitor unit (DC voltage applying servo capacitor elements DCS1 to DCS4 and AC voltage applying servo capacitor elements ACS1 to ACS4) is provided in the mass body MS as the configuration element separate from the detection capacitor unit (refer to FIG. 5). Thereby, as described above, it is possible to simultaneously operate the detection operation of the acceleration and the servo operation that cancels the displacement of the mass body MS.

For example, there is a technique of miniaturizing the acceleration sensor by providing a capacitance element that serves as both the detection capacitor unit and the servo capacitor unit. In the technique, since the detection capacitor unit and the servo capacitor unit are shared, it is necessary to alternately repeat the detection operation and the servo operation by time division processing with respect to the capacitance element that functions as the detection capacitor unit and the servo capacitor unit. Further, as the time division processing, there is also a technique of inserting a reset operation between the detection operation and the servo operation. However, the inventor newly finds that there is room for improvement as described below in the technique of providing the capacitance element that functions as the detection capacitor unit and the servo capacitor unit and of repeating the detection operation and the servo operation by the time division processing with respect to the capacitance element, and the point will be described.

(1) That is, in the case of performing the time division processing, when attempting to maintain a signal processing band of the detection operation, an internal operation speed of the acceleration sensor is doubled in the technique of alternately repeating the detection operation and the servo operation, and the internal operation speed of the acceleration sensor is quadrupled in the technique of adding the reset operation. This means that the power consumption of the analog circuit such as the amplifier, the filter, and the A/D converter, a logic circuit, and the servo control unit increases. That is, in the technique of performing the time division processing, the acceleration sensor can be miniaturized while the power consumption of the acceleration sensor increases when attempting to maintain equivalent performance due to the capacitance element that functions as both the detection capacitor unit and the servo capacitor unit.

(2) Next, in the time division processing, since it is necessary to switch between the detection operation and the servo operation, a switching operation for switching between the detection operation and the servo operation is required. This means, in the technique of performing the time division processing, that the sampling noise (kT/C noise, k is the Boltzmann constant) caused by the switching operation unavoidably exists, thereby increasing the noise density. That is, in the technique of performing the time division processing, the unavoidable sampling noise inevitably exists, thereby causing an increase in the noise of the acceleration sensor. In other words, in the technique of performing the time division processing, the S/N ratio tends to deteriorate due to the increase of a noise level and the detection accuracy of the acceleration may decrease.

(3) Further, in the case of performing the time division processing, it is necessary to increase the servo voltage or increase the electrostatic capacitance of the capacitance element in order to secure effective electrostatic force. Regarding this point, it is necessary to use a high voltage and low noise circuit in order to increase the servo voltage. However, it is difficult to design the high voltage and low noise circuit and, in the first place, secure a breakdown voltage of a MOSFET configuring the high voltage and low noise circuit. On the other hand, the increase in the electrostatic capacitance of the capacitance element means an increase in an electrode area of the capacitance element. In the first place, this is in contradiction to the design concept of miniaturizing the capacitance element by using the element as both the detection capacitor unit and the servo capacitor unit with the time division processing, and the merit of miniaturization by sharing the detection capacitor unit and the servo capacitor unit is lost.

As described above, there is room for improvement as described above in the technique of providing the capacitance element that functions as both the detection capacitor unit and the servo capacitor unit and of repeating the detection operation and the servo operation by the time division processing with respect to the capacitance element.

In contrast, in the acceleration sensor according to the embodiment 2, for example, as illustrated in FIG. 5, the servo capacitor unit (DC voltage applying servo capacitor elements DCS1 to DCS4 and AC voltage applying servo capacitor elements ACS1 to ACS4) is provided in the mass body MS as the configuration element separate from the detection capacitor unit (first feature point). Thereby, according to the acceleration sensor in the embodiment 2, it is possible to simultaneously operate the detection operation of the acceleration and the servo operation that cancels the displacement of the mass body MS. That is, according to the acceleration sensor in the embodiment 2, since it is possible to simultaneously operate the detection operation and the servo operation by the first feature point that the servo capacitor unit is provided in the mass body MS as the configuration element separate from the detection capacitor unit, it becomes unnecessary to perform the detection operation and the servo operation by the time division processing. As a result, according to the acceleration sensor in the embodiment 2, it is possible to suppress the appearance of room for improvement caused by employing the time division processing. That is, according to the acceleration sensor in the embodiment 2, it is possible to suppress (1) the increase of power consumption and (2) the decrease in the detection accuracy of the acceleration by the time division processing. As a result, it is possible to provide the high sensitivity acceleration sensor with high S/N ratio without causing the increase of power consumption.

In particular, in the embodiment 2, for example, as illustrated in FIG. 5, the servo capacitor unit is configured by being separated into the DC voltage applying servo capacitor elements DCS1 to DCS4 and the AC voltage applying servo capacitor elements ACS1 to ACS4 in addition to providing the servo capacitor unit in the mass body MS as the configuration element separate from the detection capacitor unit. Thereby, according to the embodiment 2, it is possible to apply separate voltages independently to the DC voltage applying servo capacitor elements DCS1 to DCS4 and the AC voltage applying servo capacitor elements ACS1 to ACS4 of the servo capacitor unit. Therefore, according to the embodiment 2, it is possible to individually control the DC voltage component of the servo voltage the AC voltage component of the servo voltage. As described above, it becomes unnecessary to apply an offset voltage to the AC voltage component of the servo voltage corresponding to the infinitesimal vibration acceleration by independently separating the DC voltage applying servo capacitor elements DCS1 to DCS4. This means that the output voltage from the one bit D/A converter 109 can be reduced and the electrostatic capacitance of the AC voltage applying servo capacitor elements ACS1 to ACS4 can be reduced. Accordingly, according to the embodiment 2, it is possible to reduce the power consumption for charging and discharging the AC voltage applying servo capacitor elements ACS1 to ACS4. Therefore, according to the embodiment 2, there is a synergistic factor between the point that the servo capacitor unit is configured by being separated into the DC voltage applying servo capacitor elements DCS1 to DCS4 and the AC voltage applying servo capacitor elements ACS1 to ACS4 and the point that the time division processing in which the power consumption increases is not employed. As a result, according to the acceleration sensor in the embodiment 2, it is possible to significantly reduce the power consumption.

A second feature point according to the embodiment 2 is in that the detection capacitor unit and the servo capacitor unit formed in the sensor element are separated electrically. Specifically, as illustrated in FIG. 5, the variable capacitor element VCAP1 and the variable capacitor element VCAP2 configuring the detection capacitor unit are connected electrically to an input (inverting input) of the charge amplifier 101a. On the other hand, the DC voltage applying servo capacitor elements DCS1 and DCS2 and the AC voltage applying servo capacitor elements ACS1 and ACS2 configuring the servo capacitor unit are connected electrically to each other and connected to a terminal TE1. That is, the DC voltage applying servo capacitor elements DCS1 and DCS2 and the AC voltage applying servo capacitor elements ACS1 and ACS2 configuring the servo capacitor unit are not connected electrically to the input of the charge amplifier 101a. In other words, the DC voltage applying servo capacitor elements DCS1 and DCS2 and the AC voltage applying servo capacitor elements ACS1 and ACS2 configuring the servo capacitor unit are separated (insulated) electrically from the input of the charge amplifier 101a. Accordingly, the detection capacitor unit (variable capacitor element VCAP1 and variable capacitor element VCAP2) and the servo capacitor unit (DC voltage applying servo capacitor elements DCS1 and DCS2 and AC voltage applying servo capacitor elements ACS1 and ACS2) are separated (insulated) electrically.

Similarly, the variable capacitor element VCAP3 and the variable capacitor element VCAP4 configuring the detection capacitor unit are connected electrically to an input (inverting input) of the charge amplifier 101b. On the other hand, the DC voltage applying servo capacitor elements DCS3 and DCS4 and the AC voltage applying servo capacitor elements ACS3 and ACS4 configuring the servo capacitor unit are connected electrically to each other and connected to a terminal TE2. That is, the DC voltage applying servo capacitor elements DCS3 and DCS4 and the AC voltage applying servo capacitor elements ACS3 and ACS4 configuring the servo capacitor unit are not connected electrically to the input of the charge amplifier 101b. In other words, the DC voltage applying servo capacitor elements DCS3 and DCS4 and the AC voltage applying servo capacitor elements ACS3 and ACS4 configuring the servo capacitor unit are separated (insulated) electrically from the input of the charge amplifier 101b. Accordingly, the detection capacitor unit (variable capacitor element VCAP3 and the variable capacitor element VCAP4) and the servo capacitor unit (DC voltage applying servo capacitor elements DCS3 to DCS4 and AC voltage applying servo capacitor elements ACS3 to ACS4) are separated (insulated) electrically.

Thereby, according to the embodiment 2, it is possible to obtain the following advantages and the advantages will be described. That is, the modulation signal is applied to the detection capacitor unit. However, in the case where the detection capacitor unit and the servo capacitor unit are connected electrically, the modulation signal may leak to the DC servo control unit 105 side and the one bit D/A converter 109 side illustrated in FIG. 5 through the servo capacitor unit. That is, since the servo capacitor unit is configured to have a capacitance element and the capacitance element passes an AC signal, in the case where the detection capacitor unit and the servo capacitor unit are connected electrically, a part of the modulation signal applied to the detection capacitor unit leaks into the circuit of the ASIC through the servo capacitor unit. In the case, the leaked modulation signal causes a noise and the noise may lower the detection sensitivity of the acceleration.

Regarding this point, in the embodiment 2, the detection capacitor unit and the servo capacitor unit formed in the sensor element are separated electrically (second feature point). Accordingly, according to the embodiment 2, it is possible to suppress the leakage of the modulation signal applied to the detection capacitor unit into the ASIC through the servo capacitor unit. This means that the generation of the noise caused by the leakage of the modulation signal can be suppressed. As a result, according to the embodiment 2, it is possible to maintain the high S/N ratio and improve the detection sensitivity of the acceleration.

Further, according to the second feature point of the embodiment 2, it is possible to obtain the following advantage. For example, when the acceleration is applied and the mass body MS is displaced, the electrostatic capacitance of the variable capacitor element VCAP1 and the variable capacitor element VCAP2 configuring the detection capacitor unit changes and the electrostatic capacitance of the DC voltage applying servo capacitor elements DCS1 and DCS2 and the AC voltage applying servo capacitor elements ACS1 and ACS2 configuring the servo capacitor unit changes. Accordingly, when the detection capacitor unit (variable capacitor elements VCAP1 and VCAP2) and the servo capacitor unit (DC voltage applying servo capacitor elements DCS1 and DCS2 and AC voltage applying servo capacitor elements ACS1 and ACS2) are connected electrically, a transfer of an amount of charge based on the change in the electrostatic capacitance of the servo capacitor unit is generated in the charge amplifier 101a in addition to a transfer of an amount of charge based on the change in the electrostatic capacitance of the detection capacitor unit. This means that a noise component (N1) based on the change in the electrostatic capacitance of the servo capacitor unit is superimposed also on the voltage signal converted by the charge amplifier 101a in addition to the signal component (2ΔCV/Cf) based on the change in the electrostatic capacitance of the detection capacitor unit.

Similarly, when the acceleration is applied and the mass body MS is displaced, the electrostatic capacitance of the variable capacitor element VCAP3 and the variable capacitor element VCAP4 configuring the detection capacitor unit changes and the electrostatic capacitance of the DC voltage applying servo capacitor elements DCS3 and DCS4 and the AC voltage applying servo capacitor elements ACS3 and ACS4 configuring the servo capacitor unit changes. Accordingly, it is assumed that the detection capacitor unit (variable capacitor elements VCAP3 and VCAP4) and the servo capacitor unit (DC voltage applying servo capacitor elements DCS3 and DCS4 and AC voltage applying servo capacitor elements ACS3 and ACS4) are connected electrically. In the case, a transfer of an amount of charge based on the change in the electrostatic capacitance of the servo capacitor unit is generated in the charge amplifier 101b in addition to a transfer of an amount of charge based on the change in the electrostatic capacitance of the detection capacitor unit. This means that a noise component (N2) based on the change in the electrostatic capacitance of the servo capacitor unit is superimposed also on the voltage signal converted by the charge amplifier 101b in addition to the signal component (−2ΔCV/Cf) based on the change in the electrostatic capacitance of the detection capacitor unit.

Here, also in the embodiment 2, similarly to the embodiment 1, a differential configuration is employed by the amplifier 102 to obtain a differential between the voltage signal output from the charge amplifier 101a and the voltage signal output from the charge amplifier 101b. Accordingly, the noise component (N1) included in the voltage signal output from the charge amplifier 101a and the noise component (N2) included in the voltage signal output from the charge amplifier 101b are subtracted. At the time, it is considered that the servo capacitor unit (DC voltage applying servo capacitor elements DCS1 and DCS2 and AC voltage applying servo capacitor elements ACS1 and ACS2) has substantially the same configuration as the servo capacitor unit (DC voltage applying servo capacitor elements DCS3 to DCS4 and AC voltage applying servo capacitor elements ACS3 to ACS4). Therefore, it is considered that the noise component (N1) based on the change in the electrostatic capacitance of the servo capacitor unit (DC voltage applying servo capacitor elements DCS1 and DCS2 and AC voltage applying servo capacitor elements ACS1 and ACS2) and the noise component (N2) based on the change in the electrostatic capacitance of the servo capacitor unit (DC voltage applying servo capacitor elements DCS3 to DCS4 and AC voltage applying servo capacitor elements ACS3 to ACS4) are in the same phase and equal to each other. Accordingly, when the differential configuration described above is employed, cancellation occurs between the noise component (N1) included in the voltage signal output from the charge amplifier 101a and the noise component (N2) included in the voltage signal output from the charge amplifier 101b. That is, in the case of employing the differential configuration described above, even when the detection capacitor unit and the servo capacitor unit are connected electrically, since the noise component based on the change in the electrostatic capacitance of the servo capacitor unit is cancelled, there is a low possibility that the noise component based on the change in the electrostatic capacitance of the servo capacitor unit appears as a significant problem.

However, it is realistic that there are somewhat different configurations between the servo capacitor unit (DC voltage applying servo capacitor elements DCS1 and DCS2 and AC voltage applying servo capacitor elements ACS1 and ACS2) and the servo capacitor unit (DC voltage applying servo capacitor elements DCS3 to DCS4 and AC voltage applying servo capacitor elements ACS3 to ACS4) due to, for example, the variation of fabrication accuracy. In the case, when the detection capacitor unit and the servo capacitor unit are connected electrically, the noise component based on the change in the electrostatic capacitance of the servo capacitor unit is superimposed. However, in general, it is considered that the noise component (N1) based on the change in the electrostatic capacitance of one servo capacitor unit has a different value from the noise component (N2) based on the change in the electrostatic capacitance of the other servo capacitor unit. Accordingly, for example, even when the differential configuration described above is employed, since the noise component based on the change in the electrostatic capacitance of the servo capacitor unit is not cancelled completely when the detection capacitor unit and the servo capacitor unit are connected electrically, there is a possibility that the noise component based on the change in the electrostatic capacitance of the servo capacitor unit appears as a problem.

Regarding this point, in the embodiment 2, the detection capacitor unit and the servo capacitor unit formed in the sensor element are separated electrically (second feature point). Accordingly, according to the embodiment 2, in the first place, since the detection capacitor unit and the servo capacitor unit are separated electrically, the noise component based on the change in the electrostatic capacitance of the servo capacitor unit is not superimposed on the output of the charge amplifier. That is, according to the embodiment 2, the transfer of the amount of charge caused by the change in the electrostatic capacitance of the servo capacitor unit is not mixed into the input of the charge amplifier by the second feature point. As a result, the noise component based on the change in the electrostatic capacitance of the servo capacitor unit is not superimposed on the voltage signal output from the charge amplifier. Therefore, according to the embodiment 2, even when one servo capacitor unit and the other servo capacitor unit have somewhat different configurations due to, for example, the variation of fabrication accuracy, it is possible to suppress that the noise component based on the change in the electrostatic capacitance of the servo capacitor unit appears as a problem. Thereby, according to the acceleration sensor in the embodiment 2, it is possible to maintain the high S/N ratio and improve the detection sensitivity of the acceleration.

According to the second feature point in the embodiment 2, it is possible to further obtain the following advantage. For example, in a case where the detection capacitor unit and the servo capacitor unit are connected electrically, the servo capacitor unit is connected electrically to the input of the charge amplifier inevitably. In the case, this means that the servo voltage applied to the servo capacitor unit is mixed into the input of the charge amplifier. Thereby, the noise component caused by the mixing of the servo voltage is superimposed on the voltage signal output from the charge amplifier.

Accordingly, a noise component (NS1) caused by the mixing of the servo voltage is included in the voltage signal output from one charge amplifier 101a and a noise component (NS2) caused by the mixing of the servo voltage is included in the voltage signal output from the other charge amplifier 101b. However, in the case of employing the differential configuration described above, the noise component (NS1) included in the voltage signal output from one charge amplifier 101a and the noise component (NS2) included in the voltage signal output from the other charge amplifier 101b are subtracted.

At the time, in a case where one servo capacitor unit and the other servo capacitor unit are considered to have substantially the same configuration, it can be considered that the noise component (NS1) based on the mixing of the servo voltage applied to one servo capacitor unit and the noise component (NS2) based on the mixing of the servo voltage applied to the other servo capacitor unit are in the same phase and equal to each other. Accordingly, when the differential configuration described above is employed, cancellation occurs between the noise component (NS1) included in the voltage signal output from the charge amplifier 101a and the noise component (NS2) included in the voltage signal output from the charge amplifier 101b.

However, it is realistic that there are somewhat different configurations between one servo capacitor unit and the other servo capacitor unit due to, for example, the variation of fabrication accuracy. In the case, when the detection capacitor unit and the servo capacitor unit are connected electrically, the noise component based on the mixing of the servo voltage applied to the servo capacitor unit is superimposed. However, in general, it is considered that the noise component (NS1) based on the mixing of the servo voltage applied to one servo capacitor unit has a different value from the noise component (NS2) based on the mixing of the servo voltage applied to the other servo capacitor unit.

Accordingly, for example, even when the differential configuration described above is employed, since the noise component based on the mixing of the servo voltage applied to the detection capacitor unit is not cancelled completely when the detection capacitor unit and the servo capacitor unit are connected electrically, there is a possibility that the noise component based on the mixing of the servo voltage applied to the servo capacitor unit appears as a problem.

Regarding this point, in the embodiment 2, the detection capacitor unit and the servo capacitor unit formed in the sensor element are separated electrically (second feature point). Accordingly, according to the embodiment 2, in the first place, since the detection capacitor unit and the servo capacitor unit are separated electrically, the noise component based on the mixing of the servo voltage applied to the servo capacitor unit is not superimposed on the output of the charge amplifier. That is, according to the embodiment 2, the servo voltage applied to the servo capacitor unit is not mixed into the input of the charge amplifier by the second feature point. As a result, the noise component based on the mixing of the servo voltage applied to the servo capacitor unit is not superimposed on the voltage signal output from the charge amplifier. Therefore, according to the embodiment 2, even when one servo capacitor unit and the other servo capacitor unit have somewhat different configurations due to, for example, the variation of fabrication accuracy, it is possible to suppress that the noise component based on the mixing of the servo voltage applied to the servo capacitor unit appears as a problem. Thereby, according to the acceleration sensor in the embodiment 2, it is possible to maintain the high S/N ratio and improve the detection sensitivity of the acceleration.

<Device Structure of Sensor Element According to Embodiment 2>

Next, a device structure of the sensor element according to the embodiment 2 will be described.

FIG. 6 is a cross-sectional view illustrating a device structure of a sensor element SE1 of the acceleration sensor according to the embodiment 2. In FIG. 6, the sensor element SE1 according to the embodiment 2 includes a mass body MS which is displaced with respect to the acceleration in the z direction inside a cavity CAV. The mass body MS includes the variable units VU1, VU2, VU3, and VU4 separated electrically from each other, a mechanical connection unit MCU1 mechanically connecting the variable unit VU1 and the variable unit VU2, a mechanical connection unit MCU2 mechanically connecting the variable unit VU2 and the variable unit VU3, and a mechanical connection unit MCU3 mechanically connecting the variable unit VU3 and the variable unit VU4.

The mass body MS is formed in an SOI layer configured to have an insulation layer IL, a conductor layer CL1 formed on the surface of the insulation layer IL, and a conductor layer CL2 formed on the back surface of the insulation layer IL. For example, the conductor layer CL1 and the conductor layer CL2 are formed from a semiconductor layer made of silicon, and the insulation layer IL is formed from a silicon oxide layer.

Specifically, the variable unit VU1 includes a variable electrode VEL1 formed by fabricating the conductor layer CL1 and a variable electrode VEL2 formed by fabricating the conductor layer CL2. That is, the insulation layer IL is formed so as to be sandwiched between the variable electrode VEL1 and the variable electrode VEL2, and the variable electrode VEL1 and the variable electrode VEL2 are connected electrically by a plug PLG1 penetrating the insulation layer IL.

The variable unit VU2 includes a variable electrode VSEL1 formed by fabricating the conductor layer CL1 and a variable electrode VSEL2 formed by fabricating the conductor layer CL2. That is, the insulation layer IL is formed so as to be sandwiched between the variable electrode VSEL1 and the variable electrode VSEL2, and the variable electrode VSEL1 and the variable electrode VSEL2 are connected electrically by a plug PLG2 penetrating the insulation layer IL.

The variable unit VU3 includes a variable electrode VEL3 formed by fabricating the conductor layer CL1 and a variable electrode VEL4 formed by fabricating the conductor layer CL2. That is, the insulation layer IL is formed so as to be sandwiched between the variable electrode VEL3 and the variable electrode VEL4, and the variable electrode VEL3 and the variable electrode VEL4 are connected electrically by a plug PLG3 penetrating the insulation layer IL.

The variable unit VU4 includes a variable electrode VSEL3 formed by fabricating the conductor layer CL1 and a variable electrode VSEL4 formed by fabricating the conductor layer CL2. That is, the insulation layer IL is formed so as to be sandwiched between the variable electrode VSEL3 and the variable electrode VSEL4, and the variable electrode VSEL3 and the variable electrode VSEL4 are connected electrically by a plug PLG4 penetrating the insulation layer IL.

In the conductor layer CL1 of the SOI layer, a part of the conductor layer CL1 is removed by etching to form a separation unit ISU11. Thereby, the variable electrode VEL1 of the variable unit VU1 formed in the conductor layer CL1 and the variable electrode VSEL1 of the variable unit VU2 formed in the conductor layer CL1 are separated by the separation unit ISU11.

On the other hand, in the conductor layer CL2 of the SOI layer, a part of the conductor layer CL2 is removed by etching to form a separation unit ISU12 and a separation unit ISU13. Thereby, the variable electrode VEL2 of the variable unit VU1 formed in the conductor layer CL2 and the variable electrode VSEL2 of the variable unit VU2 formed in the conductor layer CL2 are separated by the separation unit ISU12 and the separation unit ISU13. In the conductor layer CL2 of the SOI layer, the mechanical connection unit MCU1 formed by the conductor layer CL2 is formed so as to be sandwiched between the separation unit ISU12 and the separation unit ISU13. Thereby, the variable unit VU1 and the variable unit VU2 formed in the SOI layer are connected mechanically by the mechanical connection unit MCU1 while being separated electrically by the separation unit ISU11, the separation unit ISU12, and the separation unit ISU13. At the time, as illustrated in FIG. 6, in a cross-sectional view, the separation unit ISU11 is formed on the mechanical connection unit MCU1, and the mechanical connection unit MCU1 includes the separation unit ISU11. The mechanical connection unit MCU1 is provided so as to be sandwiched between the separation unit ISU12 and the separation unit ISU13. The mechanical connection unit MCU1 mechanically connects the variable unit VU1 and the variable unit VU2 separated in the x direction orthogonal to the z direction.

In the conductor layer CL1 of the SOI layer, a part of the conductor layer CL1 is removed by etching to form a separation unit ISU21. Thereby, the variable electrode VSEL1 of the variable unit VU2 formed in the conductor layer CL1 and the variable electrode VEL3 of the variable unit VU3 formed in the conductor layer CL1 are separated by the separation unit ISU21.

On the other hand, in the conductor layer CL2 of the SOI layer, a part of the conductor layer CL2 is removed by etching to form a separation unit ISU22 and a separation unit ISU23. Thereby, the variable electrode VSEL2 of the variable unit VU2 formed in the conductor layer CL2 and the variable electrode VEL4 of the variable unit VU3 formed in the conductor layer CL2 are separated by the separation unit ISU22 and the separation unit ISU23. In the conductor layer CL2 of the SOI layer, the mechanical connection unit MCU2 formed by the conductor layer CL2 is formed so as to be sandwiched between the separation unit ISU22 and the separation unit ISU23. Thereby, the variable unit VU2 and the variable unit VU3 formed in the SOI layer are connected mechanically by the mechanical connection unit MCU2 while being separated electrically by the separation unit ISU21, the separation unit ISU22, and the separation unit ISU23. At the time, as illustrated in FIG. 6, in a cross-sectional view, the separation unit ISU21 is formed on the mechanical connection unit MCU2, and the mechanical connection unit MCU2 includes the separation unit ISU21. The mechanical connection unit MCU2 is provided so as to be sandwiched between the separation unit ISU22 and the separation unit ISU23. The mechanical connection unit MCU2 mechanically connects the variable unit VU2 and the variable unit VU3 separated in the x direction orthogonal to the z direction.

In the conductor layer CL1 of the SOI layer, a part of the conductor layer CL1 is removed by etching to form a separation unit ISU31. Thereby, the variable electrode VEL3 of the variable unit VU3 formed in the conductor layer CL1 and the variable electrode VSEL3 of the variable unit VU4 formed in the conductor layer CL1 are separated by the separation unit ISU31.

On the other hand, in the conductor layer CL2 of the SOI layer, a part of the conductor layer CL2 is removed by etching to form a separation unit ISU32 and a separation unit ISU33. Thereby, the variable electrode VEL4 of the variable unit VU3 formed in the conductor layer CL2 and the variable electrode VSEL4 of the variable unit VU4 formed in the conductor layer CL2 are separated by the separation unit ISU32 and the separation unit ISU33. In the conductor layer CL2 of the SOI layer, the mechanical connection unit MCU3 formed by the conductor layer CL2 is formed so as to be sandwiched between the separation unit ISU32 and the separation unit ISU33. Thereby, the variable unit VU3 and the variable unit VU4 formed in the SOI layer are connected mechanically by the mechanical connection unit MCU3 while being separated electrically by the separation unit ISU31, the separation unit ISU32, and the separation unit ISU33. At the time, as illustrated in FIG. 6, in a cross-sectional view, the separation unit ISU31 is formed on the mechanical connection unit MCU3, and the mechanical connection unit MCU3 includes the separation unit ISU31. The mechanical connection unit MCU3 is provided so as to be sandwiched between the separation unit ISU32 and the separation unit ISU33. The mechanical connection unit MCU3 mechanically connects the variable unit VU3 and the variable unit VU4 separated in the x direction orthogonal to the z direction.

The variable unit VU1 and the mechanical connection unit MCU1 have an overlap region in the x direction and the y direction. In the embodiment 2, the insulation layer IL spreading in the xy plane is disposed in the overlap region. Thereby, the variable unit VU1 and the mechanical connection unit MCU1 are connected mechanically and separated electrically.

The variable unit VU2 and the mechanical connection unit MCU1 have an overlap region in the x direction and the y direction. In the embodiment 2, the insulation layer IL spreading in the xy plane is disposed in the overlap region. Thereby, the variable unit VU2 and the mechanical connection unit MCU1 are connected mechanically and separated electrically.

As described above, the variable unit VU1 and the variable unit VU2 are connected mechanically by the mechanical connection unit MCU1 while being separated electrically by the separation unit ISU11. The insulation layer IL is interposed between the variable unit VU1 and the mechanical connection unit MCU1 and the insulation layer IL is interposed also between the variable unit VU2 and the mechanical connection unit MCU2. Accordingly, it can be said that the variable unit VU1 and the mechanical connection unit MCU1 are connected mechanically through the insulation material and the variable unit VU2 and the mechanical connection unit MCU1 are also connected mechanically through the insulation material. Similarly, the variable unit VU2 and the mechanical connection unit MCU2 are connected mechanically through the insulation material and the variable unit VU3 and the mechanical connection unit MCU2 are also connected mechanically through the insulation material. Further, the variable unit VU3 and the mechanical connection unit MCU3 are connected mechanically through the insulation material and the variable unit VU4 and the mechanical connection unit MCU3 are also connected mechanically through the insulation material.

As illustrated in FIG. 6, in the sensor element SE1 according to the embodiment 2, there is formed a fixed unit FU configured to have a cap unit and abase unit so as to surround the SOI layer in which the variable units VU1 to VU4 and the mechanical connection units MCU1 to MCU3 are formed through the space (cavity). In the fixed unit FU, there are formed a fixed electrode FEL1, a fixed electrode FEL2, a fixed electrode FEL3, a fixed electrode FEL4, a fixed electrode DSEL1, a fixed electrode DSEL2, a fixed electrode DSEL3, a fixed electrode DSEL4, a fixed electrode ASEL1, a fixed electrode ASEL2, a fixed electrode ASEL3, and a fixed electrode ASEL4.

Specifically, as illustrated in FIG. 6, the fixed electrode FEL1 is disposed in the cap unit of the fixed unit FU so as to face the variable electrode VEL1 of the variable unit VU1, and the fixed electrode FEL2 is disposed in the base unit of the fixed unit FU so as to face the variable electrode VEL2 of the variable unit VU1. The fixed electrode FEL3 is disposed in the cap unit of the fixed unit FU so as to face the variable electrode VEL3 of the variable unit VU3, and the fixed electrode FEL4 is disposed in the base unit of the fixed unit FU so as to face the variable electrode VEL4 of the variable unit VU3. Similarly, the fixed electrode DSEL1 and the fixed electrode ASEL1 are disposed in the cap unit of the fixed unit FU so as to face the variable electrode VSEL1 of the variable unit VU2, and the fixed electrode DSEL2 and the fixed electrode ASEL2 are disposed in the base unit of the fixed unit FU so as to face the variable electrode VSEL2 of the variable unit VU2. The fixed electrode DSEL3 and the fixed electrode ASEL3 are disposed in the cap unit of the fixed unit FU so as to face the variable electrode VSEL3 of the variable unit VU4, and the fixed electrode DSEL4 and the fixed electrode ASEL4 are disposed in the base unit of the fixed unit FU so as to face the variable electrode VSEL4 of the variable unit VU4.

Thereby, in the sensor element SE1 according to the embodiment 2, the variable capacitor element VCAP1 configuring the capacitor detection unit is formed by the variable unit VU1 and the fixed electrode FEL1, and the variable capacitor element VCAP2 configuring the capacitor detection unit is formed by the variable unit VU1 and the fixed electrode FEL2. Similarly, the variable capacitor element VCAP3 of the detection capacitor unit is formed by the variable unit VU3 and the fixed electrode FEL3, and the variable capacitor element VCAP4 configuring the detection capacitor unit is formed by the variable unit VU3 and the fixed electrode FEL4.

At the time, in a case where the acceleration is applied to the sensor element SE1 and the mass body MS is displaced, it is configured such that one electrostatic capacitance of the variable capacitor element VCAP1 and the variable capacitor element VCAP2 increases while the other electrostatic capacitance decreases. Similarly, in a case where the acceleration is applied to the sensor element SE1 and the mass body MS is displaced, it is configured such that one electrostatic capacitance of the variable capacitor element VCAP3 and the variable capacitor element VCAP4 increases while the other electrostatic capacitance decreases.

The DC voltage applying servo capacitor element DCS1 configuring the servo capacitor unit is formed by the variable unit VU2 and the fixed electrode DSEL1, and the DC voltage applying servo capacitor element DCS2 configuring the servo capacitor unit is formed by the variable unit VU2 and the fixed electrode DSEL2. Similarly, the DC voltage applying servo capacitor element DCS3 configuring the servo capacitor unit is formed by the variable unit VU4 and the fixed electrode DSEL3, and the DC voltage applying servo capacitor element DCS4 configuring the servo capacitor unit is formed by the variable unit VU4 and the fixed electrode DSEL4. Further, the AC voltage applying servo capacitor element ACS1 configuring the servo capacitor unit is formed by the variable unit VU2 and the fixed electrode ASEL1, and the AC voltage applying servo capacitor element ACS2 configuring the servo capacitor unit is formed by the variable unit VU2 and the fixed electrode ASEL2. Similarly, the AC voltage applying servo capacitor element ACS3 configuring the servo capacitor unit is formed by the variable unit VU4 and the fixed electrode ASEL3, and the AC voltage applying servo capacitor element ACS4 configuring the servo capacitor unit is formed by the variable unit VU4 and the fixed electrode ASEL4.

As described above, the sensor element SE1 according to the embodiment 2 is configured. Hereinafter, feature points of the sensor element SE1 according to the embodiment 2 configured as described above will be described.

<Features of Sensor Element According to Embodiment 2>

A third feature point according to the embodiment 2 is in that the variable units VU1 to VU4 configuring the mass body MS are formed by fabricating the same SOI layer on the premise of using the manufacturing technique of the MEMS structure. Thereby, first, based on the premise, since each of the variable units VU1 to VU4 is formed as the MEMS structure, the manufacturing variation (fabrication accuracy) between the variable units VU1 to VU4 can be reduced.

Further, in the sensor element SE1 according to the embodiment 2, the variable units VU1 to VU4 are formed by fabricating the same SOI layer. Accordingly, it is possible to reduce the manufacturing variation between the variable units VU1 to VU4 compared with a case where the variable units VU1 to VU4 are fabricated as separate layers.

This is the third feature point according to the embodiment 2. According to the embodiment 2, it is possible to reduce the manufacturing variation between the variable units VU1 to VU4 by a synergistic effect of the premise and the third feature point described above. As a result, according to the embodiment 2, for example, it is possible to suppress the deviation ("mismatch") between electrostatic capacitance of the detection capacitor pair configured to have the variable capacitor element VCAP1 and the variable capacitor element VCAP2 and electrostatic capacitance of the detection capacitor pair configured to have the variable capacitor element VCAP3 and the variable capacitor element VCAP4 illustrated in FIG. 6.

Further, according to the embodiment 2, it is possible to suppress the deviation ("mismatch") between electrostatic capacitance of the servo capacitor pair configured to have the DC voltage applying servo capacitor element DCS1 and the DC voltage applying servo capacitor element DCS2 and electrostatic capacitance of the servo capacitor pair configured to have the DC voltage applying servo capacitor element DCS3 and the DC voltage applying servo capacitor element DCS4.

Similarly, according to the embodiment 2, it is possible to suppress the deviation ("mismatch") between electrostatic capacitance of the servo capacitor pair configured to have the AC voltage applying servo capacitor element ACS1 and the AC voltage applying servo capacitor element ACS2 and electrostatic capacitance of the servo capacitor pair configured to have the AC voltage applying servo capacitor element ACS3 and the AC voltage applying servo capacitor element ACS4.

As described above, according to the acceleration sensor in the embodiment 2, it is possible to suppress the deviation ("mismatch") of the electrostatic capacitance caused by the manufacturing variation of the variable units VU1 to VU4 configuring the mass body MS and suppress the noise caused by the deviation of the electrostatic capacitance. As a result, according to the embodiment 2, it is possible to provide the high sensitivity acceleration sensor with low noise and high S/N ratio.

A fourth feature point according to the embodiment 2 is in that on the premise of the third feature point in which the variable units VU1 to VU4 are formed in the same SOI layer, further, the variable units VU1 to VU4 are connected mechanically by the mechanical connection units MCU1 to MCU3 while being separated electrically from each other. Thereby, according to the sensor element SE1 in the embodiment 2, it is possible to suppress the deviation ("mismatch") between the electrostatic capacitance of one detection capacitor pair (variable capacitor element VCAP1 and variable capacitor element VCAP2) and the electrostatic capacitance of the other detection capacitor pair (variable capacitor element VCAP3 and variable capacitor element VCAP4) illustrated in FIG. 6. Further, according to the sensor element SE1 in the embodiment 2, it is possible to suppress the deviation ("mismatch") between the electrostatic capacitance of one DC servo capacitor pair (DC voltage applying servo capacitor element DCS1 and DC voltage applying servo capacitor element DCS2) and the electrostatic capacitance of the other DC servo capacitor pair (DC voltage applying servo capacitor element DCS3 and DC voltage applying servo capacitor element DCS4) illustrated in FIG. 6. Similarly, according to the sensor element SE1 in the embodiment 2, it is possible to suppress the deviation ("mismatch") between the electrostatic capacitance of one AC servo capacitor pair (AC voltage applying servo capacitor element ACS1 and AC voltage applying servo capacitor element ACS2) and the electrostatic capacitance of the other AC servo capacitor pair (AC voltage applying servo capacitor element ACS3 and AC voltage applying servo capacitor element ACS4) illustrated in FIG. 6.

For example, as illustrated in FIG. 6, in the case where the variable units VU1 to VU4 are connected by the mechanical connection units MCU1 to MCU3, the variable units VU1 to VU4 are formed mechanically and integrally even while being separated electrically from each other. This means that even in a case where inertia force is applied from the outside, the variable units VU1 to VU4 are formed such that a distance between the variable electrodes (VEL1, VSEL1, VEL3, and VSEL3) disposed in the conductor layer CL1 of the variable units VU to VU4 is substantially equal to a distance between the fixed electrodes (FEF1, DSEL1, ASEL1, FEL3, DSEL3, and ASEL3) disposed in the cap unit of the fixed unit FU. Similarly, the variable units VU1 to VU4 are formed such that a distance between the variable electrodes (VEL2, VSEL2, VEL4, and VSEL4) disposed in the conductor layer CL2 of the variable units VU1 to VU4 is substantially equal to a distance between the fixed electrodes (FEL2, DSEL2, ASEL2, FEL4, DSEL4, and ASEL4) disposed in the base unit of the fixed unit FU.

In the sensor element SE1 according to the embodiment 2, the detection capacitor unit that captures the acceleration as a change of electrostatic capacitance and the servo capacitor unit to which the servo voltage is applied are formed, and the detection capacitor unit and the servo capacitor unit are connected mechanically through the insulation material. That is, in the embodiment 2, since the detection capacitor unit and the servo capacitor unit are connected mechanically through the insulation material, basically, it can be said that the detection capacitor unit and the servo capacitor unit are separated electrically. However, the fact that the insulation material is interposed between the detection capacitor unit and the servo capacitor unit means that parasitic capacitance is formed between the detection capacitor unit and the servo capacitor unit. As a result, strictly speaking, it can be said that the detection capacitor unit and the servo capacitor unit are separated electrically in terms of DC, but it can also be interpreted that the units are connected through the parasitic capacitance in terms of AC. However, in the embodiment 2, the meaning that the detection capacitor unit and the servo capacitor unit are separated electrically is that the detection capacitor unit and the servo capacitor unit are separated electrically in terms of design concept, so an influence of the parasitic capacitance that unavoidably exists is ignored.

That is, for example, even in a case where the parasitic capacitance unavoidably exists, when the parasitic capacitance is a negligible level, in the embodiment 2, it is assumed that the detection capacitor unit and the servo capacitor unit are separated electrically. For example, in the embodiment 2, the electrostatic capacitance of the detection capacitor unit and the electrostatic capacitance of the servo capacitor unit are about 10 pF while electrostatic capacitance of the parasitic capacitance is about 0.25 pF. Accordingly, the electrostatic capacitance of the parasitic capacitance is the negligible level compared with the electrostatic capacitance of the detection capacitor unit and the electrostatic capacitance of the servo capacitor unit, and the detection capacitor unit and the servo capacitor unit can be considered to be separated electrically at a frequency level of the modulation signal applied to the detection capacitor unit. As described above, the detection capacitor unit and the servo capacitor unit according to the embodiment 2 are connected mechanically and separated electrically through the insulation material.

<Modification Example> (Seesaw Structure)

Next, a device structure of a sensor element SE2 according to a modification example will be described. FIG. 7 is a diagram illustrating the device structure of the sensor element SE2 according to the modification example. In particular, FIG. 7(*a*) is a plan view illustrating the device structure of the sensor element SE2 according to the modification example, FIG. 7 (*b*) is a cross-sectional view taken along line A-A of FIG. 7 (a), and FIG. 7 (c) is a cross-sectional view taken along line B-B of FIG. 7 (a).

As illustrated in FIG. 7 (a), the sensor element SE2 according to the modification example has a fixed unit FU surrounding a cavity CAV, and a mass body MS1 is provided inside the fixed unit FU. The mass body MS1 is configured to have a variable unit VU1 having a rectangular shape, a variable unit VU2 having the rectangular shape, and a variable unit VU3 sandwiched between the variable unit VU1 and the variable unit VU2. The variable unit VU1, the variable unit VU2, and the variable unit VU3 are connected mechanically by a mechanical connection unit while being separated electrically from each other.

In FIG. 7 (a), the variable unit VU1 is connected to an output unit (output electrode) OEL1 through a beam BM1 and the variable unit VU2 is connected to an output unit (output electrode) OEL2 through a beam BM2. Further, the variable unit VU3 is connected to a terminal TE through a beam BM3.

Specifically, as illustrated in FIG. 7(a), in a plan view, the output unit OEL1 is disposed in the center part of the variable unit VU1, and it is configured such that mass of the left side part of the variable unit VU1 is different from mass of the right side part of the variable unit VU1. That is, the variable unit VU1 is configured to have a variable unit VU1 (L) formed in the left side part and a variable unit VU1 (R) formed in the right side part. In a plan view, the output unit OEL2 is disposed in the center part of the variable unit VU2, and it is configured such that mass of the left side part of the variable unit VU2 is different from mass of the right side part of the variable unit VU2. That is, the variable unit VU2 is configured to have a variable unit VU2 (L) formed in the left side part and a variable unit VU2 (R) formed in the right side part. Similarly, in a plan view, the terminal TE is disposed in the center part of the variable unit VU3, and it is configured such that mass of the left side part of the variable unit VU3 is different from mass of the right side part of the variable unit VU3. That is, the variable unit VU3 is configured to have a variable unit VU3 (L) formed in the left side part and a variable unit VU3 (R) formed in the right side part.

As illustrated in FIG. 7 (b), the variable unit VU1 (refer to FIG. 7 (a)) is configured to have the variable unit VU1 (R) disposed in the right side and the variable unit VU1 (L) disposed in the left side with the output unit OEL1 as the center. At the time, the variable unit VU1 (R) and the variable unit VU1 (L) are formed in an SOI layer configured to have an insulation layer IL, a conductor layer CL1, and a conductor layer CL2. Both the variable unit VU1 (R) and the variable unit VU1 (L) are formed by fabricating the conductor layer CL1 and the conductor layer CL2, but a size of the variable unit VU1 (L) is fabricated to be smaller than a size of the variable unit VU1 (R) as illustrated in FIG. 7(b). As a result, the mass of the variable unit VU1 (R) is different from the mass of the variable unit VU1 (L). Specifically, the mass of the variable unit VU1 (L) becomes lighter than the mass of the variable unit VU1 (R). As described above, in the sensor element SE2 according to the modification example, there is realized the sensor element SE2 of "seesaw structure" in which the mass of the variable unit VU1 (R) and the mass of the variable unit VU1 (L) are different with the output unit OEL1 disposed in the center part of the variable unit VU1 as the center. The fixed electrode FEL1 is disposed so as to face the variable unit VU1 (L), and the fixed electrode FEL2 is disposed so as to face the variable unit VU1 (R). Thereby, a variable capacitor element VCAP1 configuring a detection capacitor unit is formed by the variable electrode VEL1 of the variable unit VU1 (L) and the fixed electrode FEL1, and a variable capacitor element VCAP2 configuring the detection capacitor unit is formed by the variable electrode VEL2 of the variable unit VU1 (R) and the fixed electrode FEL2.

Next, as illustrated in FIG. 7 (c), the variable unit VU1 (L) and the variable unit VU3 (L) are connected by a mechanical connection unit MCU13 while being separated electrically from each other, and the variable unit VU3 (L) and the variable unit VU2 (L) are connected by a mechanical connection unit MCU23 while being separated electrically from each other. At the time, the variable electrode VEL1 is formed in the variable unit VU1 (L) while the fixed electrode FEL1 is formed in the fixed unit FU so as to face the variable electrode VEL1. Thereby, the variable capacitor element VCAP1 is formed by the variable electrode VEL1 of the variable unit VU1 (L) and the fixed electrode FEL1. Similarly, the variable electrode VEL3 is formed in the variable unit VU2 (L) while the fixed electrode FEL3 is formed in the fixed unit FU so as to face the variable electrode VEL3. Thereby, a variable capacitor element VCAP3 is formed by the variable electrode VEL3 of the variable unit VU2 (L) and the fixed electrode FEL3.

The variable electrode VSEL is formed in the variable unit VU3 (L) while the fixed electrode FSEL is formed in the fixed unit FU so as to face the variable electrode VSEL. Thereby, the servo capacitor element SCAP configuring a servo capacitor unit is formed by the variable electrode VEL of the variable unit VU3 (L) and the fixed electrode FSEL. As described above, the sensor element SE2 according to the modification example is configured.

In the sensor element SE2 according to the modification example, when the acceleration is applied in the z direction, the mass body MS1 is displaced in the z direction. For example, in FIG. 7(b), when the acceleration oscillating in the −z direction and +z direction is applied, the variable unit VU1 (L) and the variable unit VU1 (R) perform a seesaw operation. For example, when a distance between the variable electrode VEL1 of the variable unit VU1 (L) and the fixed electrode FEL1 is narrowed, a distance between the variable electrode VEL2 of the variable electrode VU1 (R) and the fixed electrode FEL2 is widened. On the other hand, for example, when a distance between the variable electrode VEL1 of the variable unit VU1 (L) and the fixed electrode FEL1 is widened, a distance between the variable electrode VEL2 of the variable electrode VU1 (R) and the fixed electrode FEL2 is narrowed. As a result, according to the sensor element SE2 in the modification example, it is possible to realize inverse characteristics between a change in electrostatic capacitance of the variable capacitor element VCAP1 and a change in electrostatic capacitance of the variable capacitor element VCAP2.

Further, in the sensor element SE2 according to the modification example, the servo capacitor unit is formed in the variable unit VU3. Accordingly, according to the modification example, the electrostatic force that cancels the acceleration applied to the sensor element SE2 can be added to the mass body MS1 of the sensor element SE2, thereby suppressing the displacement of the mass body MS1 caused by the acceleration.

As described above, according to the acceleration sensor in the modification example, a servo operation applying the servo voltage to the servo capacitor unit is performed while a detection operation that captures the acceleration as the change of the electrostatic capacitance is performed by the detection capacitor unit of the sensor element SE2. That is, also with the acceleration sensor according to the modification example, it is possible to simultaneously operate the detection operation of the acceleration and the servo operation that cancels the displacement of the mass body MS1.

Specific advantages of the sensor element SE2 according to the modification example include a point that the fixed electrode may be provided only on the cap unit side of the fixed unit FU and a point that the plug may not be provided in the SOI layer. As a result, the structure of the sensor element SE2 according to the modification example is simplified. Thereby, according to the modification example, it is possible to obtain an advantage of easily manufacturing the sensor element SE2.

Embodiment 3

FIG. 8 is a diagram illustrating a configuration of an acceleration sensor according to embodiment 3. In FIG. 8, the acceleration sensor according to the embodiment 3 is different from the acceleration sensor according to the embodiment 2 in that separate mass body MS1 and mass body MS2 are included.

In the embodiment 3, in the mass body MS1, there are formed a detection capacitor unit configured to have variable capacitor elements VCAP1 and VCAP2 and a servo capacitor unit configured to have DC voltage applying servo capacitor elements DCS1 and DCS2 and the AC voltage applying servo capacitor elements ACS1 and ACS2. At the time, also in the embodiment 3, the detection capacitor unit and the servo capacitor unit are separated electrically. That is, the detection capacitor unit provided in the mass body MS1 is connected electrically to an input of the charge amplifier 101a while the servo capacitor unit provided in the mass body MS1 is connected electrically to the terminal TE1 and is not connected electrically to the input of the charge amplifier 101a.

Similarly, in the mass body MS2, there are formed a detection capacitor unit configured to have variable capacitor elements VCAP3 and VCAP4 and a servo capacitor unit configured to have DC voltage applying servo capacitor elements DCS3 and DCS4 and the AC voltage applying servo capacitor elements ACS3 and ACS4. At the time, also in the embodiment 3, the detection capacitor unit and the servo capacitor unit are separated electrically. That is, the detection capacitor unit provided in the mass body MS2 is connected electrically to an input of the charge amplifier 101b while the servo capacitor unit provided in the mass body MS2 is connected electrically to the terminal TE2 and is not connected electrically to the input of the charge amplifier 101b.

Also in the acceleration sensor according to the embodiment 3 configured as described above, similarly to the embodiment 2, since the detection capacitor unit and the servo capacitor unit are separated electrically, the mixing of a noise caused by the servo capacitor unit into the charge amplifier is suppressed. As a result, also in the acceleration sensor according to the embodiment 3, it is possible to improve the detection sensitivity. In particular, in the embodiment 3, since the mass body MS1 and the mass body MS2 are separated, there is substantially no parasitic capacitance between a configuration element formed in the mass body MS1 and a configuration element formed in the mass body MS2.

Accordingly, also from this point of view, according to the acceleration sensor in the embodiment 3, it is possible to improve the detection sensitivity.

Embodiment 4

FIG. 9 is a diagram illustrating a configuration of an acceleration sensor according to embodiment 4. In FIG. 9, the acceleration sensor according to the embodiment 4 is different from the acceleration sensor according to the embodiment 2 in that a charge amplifier 101c configured to have a fully differential amplifier is used. That is, in the acceleration sensor according to the embodiment 2 illustrated in FIG. 5, charge amplifiers 101a and 101b configured to have a single end operational amplifier are used. In contrast, in the acceleration sensor according to the embodiment 4, the charge amplifier 101c configured to have the fully differential amplifier is used. According to the embodiment 4, also in the configuration, similarly to embodiment 2, since a detection capacitor unit and a servo capacitor unit are separated electrically, the mixing of the noise caused by the servo capacitor unit into the charge amplifier is suppressed. As a result, also in the acceleration sensor according to the embodiment 4, it is possible to improve the detection sensitivity. In particular, according to the embodiment 4, since the charge amplifier 101c configured to have one fully differential amplifier is used as a C/V conversion unit, it has an advantage from a viewpoint of reducing the power consumption compared with the configuration of the embodiment 2 using the two single operational amplifiers as the C/V conversion unit.

Embodiment 5

FIG. 10 is a diagram illustrating a configuration of an acceleration sensor according to embodiment 5. In FIG. 10, the acceleration sensor according to the embodiment 5 is configured by combining the configuration of the embodiment 3 and the configuration of the embodiment 4. That is, the acceleration sensor according to the embodiment 5 has separate mass body MS1 and mass body MS2 and uses a charge amplifier 101c configured to have a fully differential amplifier as illustrated in FIG. 10.

Also in the acceleration sensor according to the embodiment 5 configured as described above, similarly to the embodiment 2, since a detection capacitor unit and a servo capacitor unit are separated electrically, the mixing of a noise caused by the servo capacitor unit into a charge amplifier 101c is suppressed. As a result, also in the acceleration sensor according to the embodiment 5, it is possible to improve the detection sensitivity.

In particular, in the embodiment 5, similarly to the embodiment 3, since the mass body MS1 and the mass body MS2 are separated, there is substantially no parasitic capacitance between a configuration element formed in the mass body MS1 and a configuration element formed in the mass body MS2. Accordingly, also from this point of view, according to the acceleration sensor in the embodiment 5, it is possible to improve the detection sensitivity. Further, in the embodiment 5, similarly to the embodiment 4, since the charge amplifier 101c configured to have one fully differential amplifier is used as a C/V conversion unit, it has an advantage from a viewpoint of reducing the power consumption compared with the configuration of the embodiment 2 using the two single operational amplifiers as the C/V conversion unit.

Embodiment 6

FIG. 11 is a diagram illustrating a configuration of an acceleration sensor according to embodiment 6. In FIG. 11, the acceleration sensor according to the embodiment 6 is different from the acceleration sensor according to the embodiment 2 in that a multi-value quantizer 111 and a multi-value D/A converter 112 are used. That is, the acceleration sensor according to the embodiment 2 illustrated in FIG. 5 uses the one bit quantizer 108 and the one bit D/A converter 109, whereas the acceleration sensor according to the embodiment 6 uses the multi-value quantizer 111 and the multi-value D/A converter 112. Thereby, in a mass body MS, there are formed one AC servo capacitor pair configured to have AC voltage applying servo capacitor elements ACS1a and ACS1b and AC voltage applying servo capacitor elements ACS2a and ACS2b and the other AC servo capacitor pair configured to have AC voltage applying servo capacitor elements ACS3a and ACS3b and AC voltage applying servo capacitor elements ACS4a and ACS4b.

For example, when attention is given to one AC servo capacitor pair described above, it is considered that a case where an AC voltage component of a servo voltage determined by an AC servo control unit 107 is quantized to two bits by the multi-value quantizer 111. In the case, the output of the multi-value quantizer 111 is input to the multi-value D/A converter 112. The AC voltage component of the servo voltage quantized to two bits is converted to an analog voltage by the multi-value D/A converter 112. For example, in correspondence with two bits ("00", "01", "10", "11"), in a case where the upper bit is "1", a first AC voltage component is applied to the AC voltage applying servo capacitor element ACS1a and the first AC voltage component (antiphase) having an opposite phase is applied to the AC voltage applying servo capacitor element ACS2a. On the other hand, in a case where the lower bit is "1", a second AC voltage component is applied to the AC voltage applying servo capacitor element ACS1b and the second AC voltage component (antiphase) having the opposite phase is applied to the AC voltage applying servo capacitor element ACS2b.

Thereby, according to the embodiment 6, it is possible to finely control the magnitude of the electrostatic force that cancels the infinitesimal vibration acceleration applied to the sensor element.

For example, in the embodiment 6, as illustrated in FIG. 11, DC voltage applying servo capacitor elements DCS1 and DCS2 are connected electrically to a terminal TE1a, and the AC voltage applying servo capacitor elements ACS1a and ACS2a are connected electrically to a terminal TE1b. The AC voltage applying servo capacitor elements ACS1b and ACS2b are connected electrically to a terminal TE1c.

The terminal TE1a, the terminal TE1b, and the terminal TE1c are separated electrically from each other. Therefore, a DC servo capacitor pair (DC voltage applying servo capacitor elements DCS1 and DCS2), an AC servo capacitor pair (AC voltage applying servo capacitor elements ACS1a and ACS2a), and an AC servo capacitor pair (AC voltage applying servo capacitor elements ACS1b and ACS2b) are separated electrically from each other.

Similarly, DC voltage applying servo capacitor elements DCS3 and DCS4 are connected electrically to a terminal TE2a, the AC voltage applying servo capacitor elements ACS3a and ACS4a are connected electrically to a terminal TE2b. The AC voltage applying servo capacitor elements ACS3b and ACS4b are connected electrically to a terminal TE2c.

The terminal TE2a, the terminal TE2b, and the terminal TE2c are separated electrically from each other. Therefore, a DC servo capacitor pair (DC voltage applying servo capacitor elements DCS3 and DCS4), an AC servo capacitor pair (AC voltage applying servo capacitor elements ACS3a and ACS4a), and an AC servo capacitor pair (AC voltage applying servo capacitor elements ACS3b and ACS4b) are separated electrically from each other.

As described above, in the embodiment 6, not only a detection capacitor unit and a servo capacitor unit are separated electrically, but also configuration elements configuring the servo capacitor unit are separated electrically. As a result, according to the embodiment 6, it is possible to suppress not only the mixing of a noise caused by the servo capacitor unit into a charge amplifier, but also the mixing of signals between the configuration elements of the servo capacitor unit. Thereby, according to the acceleration sensor in the embodiment 6, the accuracy of the detection operation and the accuracy of the servo operation can be enhanced. Therefore, it is possible to improve the detection sensitivity of the acceleration.

Embodiment 7

FIG. 12 is a diagram illustrating a configuration of an acceleration sensor according to embodiment 7. In FIG. 12, the acceleration sensor according to the embodiment 7 is different from the acceleration sensor according to the embodiment 6 in that separate mass body MS1 and mass body MS2 are included.

Also in the acceleration sensor according to the embodiment 7 configured as described above, similarly to the embodiment 6, not only a detection capacitor unit and a servo capacitor unit are separated electrically, but also configuration elements configuring the servo capacitor unit are separated electrically. As a result, according to the embodiment 6, it is possible to suppress not only the mixing of a noise caused by the servo capacitor unit into a charge amplifier, but also the mixing of signals between the configuration elements of the servo capacitor unit. Further, in the embodiment 7, since the mass body MS1 and the mass body MS2 are separated, there is substantially no parasitic capacitance between a configuration element formed in the mass body MS1 and a configuration element formed in the mass body MS2. Therefore, also from this point of view, according to the acceleration sensor in the embodiment 7, it is possible to further improve the detection sensitivity of the acceleration.

Embodiment 8

FIG. 13 is a diagram illustrating a configuration of an acceleration sensor according to embodiment 8. In FIG. 13, in the acceleration sensor according to the embodiment 8, a detection capacitor unit is configured to have a variable capacitor element VCAP1 and a variable capacitor element VCAP2, and a servo capacitor unit is configured to have a DC servo capacitor pair configured to have DC voltage applying servo capacitor elements DCS1 and DCS2 and an AC servo capacitor pair configured to have AC voltage applying servo capacitor elements ACS1 and ACS2.

Also in the acceleration sensor according to the embodiment 8 configured as described above, since the detection capacitor unit and the servo capacitor unit are separated electrically, the mixing of a noise caused by the servo capacitor unit into a charge amplifier 101a is suppressed. As a result, also in the acceleration sensor according to the embodiment 8, it is possible to improve the detection sensitivity. In particular, since the acceleration sensor according to the embodiment 8 has a simple single structure that does not perform differential detection, it is possible to realize the low power consumption and miniaturization of the acceleration sensor.

The invention made by the inventor is described in detail based on the embodiments, but it goes without saying that the present invention is not limited to the embodiments and various modifications can be made within a scope of not departing from the gist of the invention.

The embodiments are described in detail in order to describe the present invention in an easily understandable manner and not necessarily limited to those including all the configuration elements described above. A part of the configuration of one embodiment can be replaced by the configuration of another embodiment, and furthermore the configuration of another embodiment can be added to the configuration of one embodiment. It is possible to add, delete, and replace another configuration with respect to a part of the configuration of each embodiment.

For example, in the embodiments, the configuration having the DC servo capacitor pair and the AC servo capacitor pair is described as the servo capacitor pair configuring the servo capacitor unit, but the present invention is not limited thereto and can be employed in a configuration having only the AC servo capacitor pair. In the case, for example, the DC servo control unit is not necessary, and it suffices to have the AC servo control unit and the like. It is possible to collectively deal with the DC voltage component and the AC voltage component of the input acceleration signal by the AC servo capacitor pair and the AC servo control unit.

In the embodiments, the acceleration sensor that detects the acceleration is described as an example of an inertia sensor that captures a physical quantity as the change of the electrostatic capacitance and detects the physical quantity based on the servo voltage generating the electrostatic force that cancels the change of the electrostatic capacitance. However, technical concept of the present invention is not limited thereto, for example, also can be employed in an angular velocity sensor that detects angular velocity.

REFERENCE SIGNS LIST

ACS1: AC voltage applying servo capacitor element
ACS2: AC voltage applying servo capacitor element
ACS3: AC voltage applying servo capacitor element
ACS4: AC voltage applying servo capacitor element
DCS1: DC voltage applying servo capacitor element
DCS2: DC voltage applying servo capacitor element
DCS3: DC voltage applying servo capacitor element
DCS4: DC voltage applying servo capacitor element
MS: mass body
VCAP1: variable capacitor element
VCAP2: variable capacitor element
VCAP3: variable capacitor element
VCAP4: variable capacitor element

The invention claimed is:

1. An inertia sensor that captures a physical quantity as a change of electrostatic capacitance and detects the physical quantity based on a servo voltage generating electric force that cancels the change of the electrostatic capacitance, the inertia sensor comprising: a detection capacitor unit that captures the physical quantity as the change of the electrostatic capacitance; and a servo capacitor unit to which the servo voltage is applied wherein the detection capacitor unit and the servo capacitor unit are connected mechanically through an insulation material, wherein the detection capacitor unit includes a detection capacitor pair, and wherein the servo capacitor unit includes a servo capacitor pair, wherein the servo voltage includes a DC voltage component and an AC voltage component, and wherein the servo capacitor unit includes a DC voltage applying servo capacitor pair to which the DC voltage component of the servo voltage is applied and an AC voltage applying servo capacitor pair to which the AC voltage component of the servo voltage is applied.

2. The inertia sensor according to claim 1,
wherein the detection capacitor unit and the servo capacitor unit are separated electrically.

3. The inertia sensor according to claim 1,
wherein the DC voltage applying servo capacitor pair and the AC voltage applying servo capacitor pair are connected electrically.

4. The inertia sensor according to claim 1,
wherein the DC voltage applying servo capacitor pair and the AC voltage applying servo capacitor pair are separated electrically.

5. The inertia sensor according to claim 1, further comprising:
a capacitance/voltage conversion unit that converts the change of the electrostatic capacitance into a voltage value,
wherein an input of the capacitance/voltage conversion unit is connected electrically to the capacitor detection unit, and
the input of the capacitance/voltage conversion unit is separated electrically to the servo capacitor unit.

6. The inertia sensor according to claim 1,
wherein in a state where a detection operation that captures the physical quantity as the change of the electrostatic capacitance is performed by the detection capacitor unit, a servo operation applying the servo voltage to the servo capacitor unit is performed.

7. An inertia sensor that captures a physical quantity as a change of electrostatic capacitance and detects the physical quantity based on a servo voltage generating electric force that cancels the change of the electrostatic capacitance, the inertia sensor comprising:
a detection capacitor unit that captures the physical quantity as the change of the electrostatic capacitance; and
a servo capacitor unit to which the servo voltage is applied,
wherein the detection capacitor unit and the servo capacitor unit are connected mechanically through an insulation material,
a mass body displaceable in a first direction,
wherein the mass body includes
a first variable unit,
a second variable unit separated electrically to the first variable unit, and
a mechanical connection unit mechanically connecting the first variable unit and the second variable unit,
wherein the inertia sensor further comprises
a first fixed electrode disposed face to the first variable unit,
a second fixed electrode disposed face to the first variable unit,
a third fixed electrode disposed face to the second variable unit,
a fourth fixed electrode disposed face to the second variable unit,
wherein a first capacitor is formed by the first variable unit and the first fixed electrode,
wherein a second capacitor is formed by the first variable unit and the second fixed electrode,
wherein a third capacitor is formed by the second variable unit and the third fixed electrode, and
wherein a fourth capacitor is formed by the second variable unit and the fourth fixed electrode,
wherein in a case where the mass body is displaced in the first direction,
capacitance of one capacitor increases while capacitance of another capacitor decreases of the first capacitor and the second capacitor, and capacitance of one capacitor increases while capacitance of another capacitor decreases of the third capacitor and the fourth capacitor, wherein the detection capacitor unit is configured to have the first capacitor and the second capacitor, and wherein the servo capacitor unit is configured to have the third capacitor and the fourth capacitor.

8. The inertia sensor according to claim 7, wherein the mechanical connection unit mechanically connects the first variable unit and the second variable unit separated in a second direction orthogonal to the first direction.

9. The inertia sensor according to claim 7, wherein the first variable unit and the second variable unit are formed from an SOI layer of the same layer, and wherein the SOI layer is formed from an insulation layer, a first conductor layer formed on a first surface of the insulation layer, and a second conductor layer formed on a second surface opposite to the first surface of the insulation layer.

10. The inertia sensor according to claim 9, wherein the first conductor layer configuring the first variable unit and the first conductor layer configuring the second variable unit are separated by a first separation unit, wherein the mechanical connection unit is formed from the second conductor layer, and wherein the second conductor layer configuring the first variable unit and the mechanical connection unit are separated by a second separation unit, and the second conductor layer configuring the second variable unit and the mechanical connection unit are separated by a third separation unit.

11. The inertia sensor according to claim 10, wherein in a cross-sectional view, the first separation unit is formed on the mechanical connection unit, and the mechanical connection unit includes the first separation unit.

12. The inertia sensor according to claim 9, wherein the first conductor layer is formed from a silicon layer, wherein the second conductor layer is formed from the silicon layer, and wherein the insulation layer is formed from a silicon oxide layer.

13. The inertia sensor according to claim 7, wherein the physical quantity is acceleration.

\* \* \* \* \*